United States Patent
Chen et al.

(10) Patent No.: US 11,960,127 B2
(45) Date of Patent: Apr. 16, 2024

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Hsien-Wei Chen, Hsinchu (TW); Jie Chen, New Taipei (TW); Ming-Fa Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/167,077

(22) Filed: Feb. 10, 2023

(65) Prior Publication Data

US 2023/0194800 A1 Jun. 22, 2023

Related U.S. Application Data

(62) Division of application No. 16/877,498, filed on May 19, 2020, now Pat. No. 11,609,391.

(51) Int. Cl.
*G02B 6/42* (2006.01)
*H01L 21/48* (2006.01)
*H01L 23/498* (2006.01)

(52) U.S. Cl.
CPC ........ *G02B 6/4202* (2013.01); *H01L 21/4853* (2013.01); *H01L 21/486* (2013.01); *H01L 23/49816* (2013.01); *H01L 23/49827* (2013.01)

(58) Field of Classification Search
None
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |

*Primary Examiner* — Telly D Green
(74) *Attorney, Agent, or Firm* — JCIPRNET

(57) ABSTRACT

A semiconductor package includes a semiconductor die, a device layer, an insulator layer, a buffer layer, and connective terminals. The device layer is stacked over the semiconductor die. The device layer includes an edge coupler located at an edge of the semiconductor package and a waveguide connected to the edge coupler. The insulator layer is stacked over the device layer and includes a first dielectric material. The buffer layer is stacked over the insulator layer. The buffer layer includes a second dielectric material. The connective terminals are disposed on the buffer layer and reach the insulator layer through contact openings of the buffer layer.

20 Claims, 40 Drawing Sheets

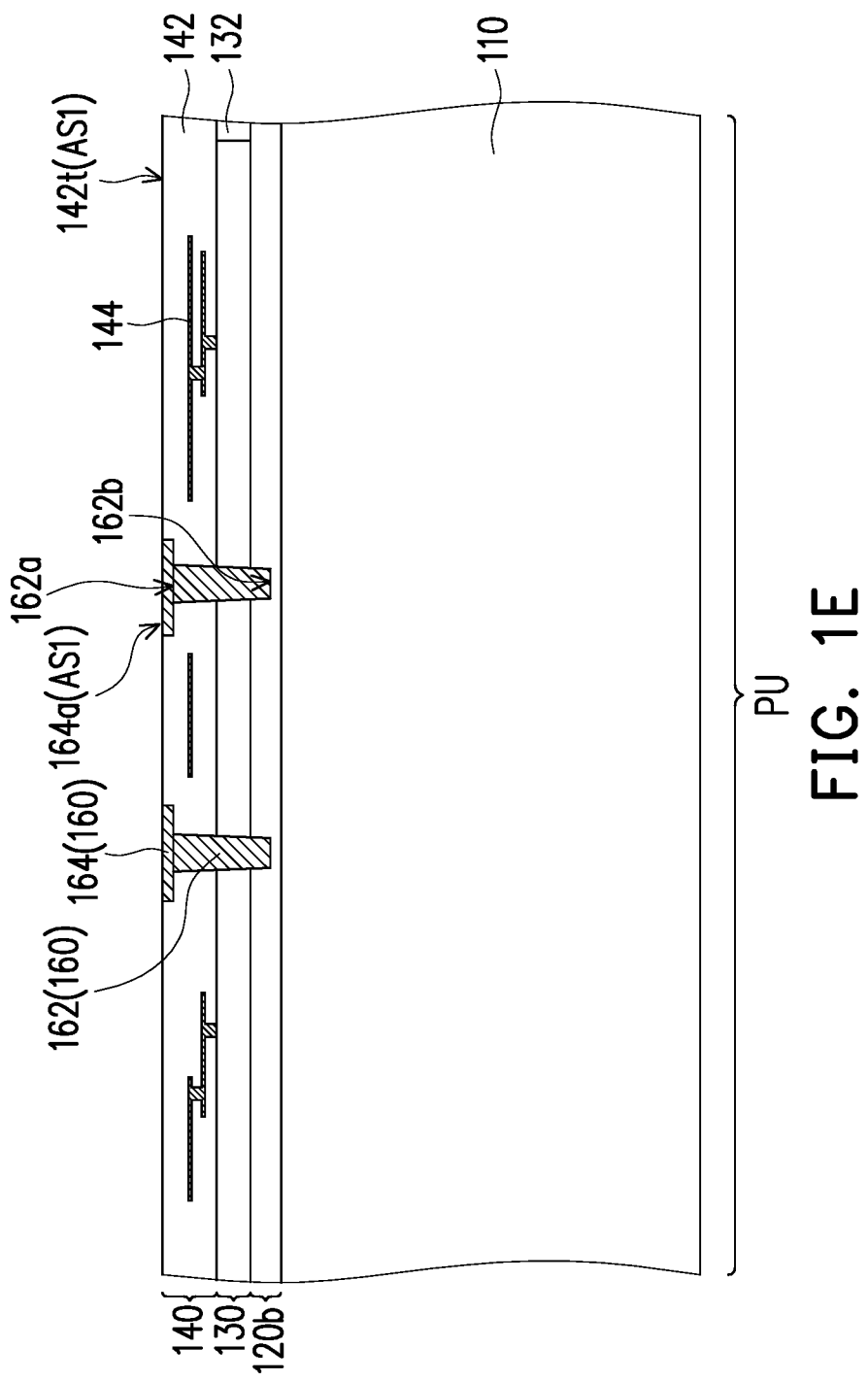

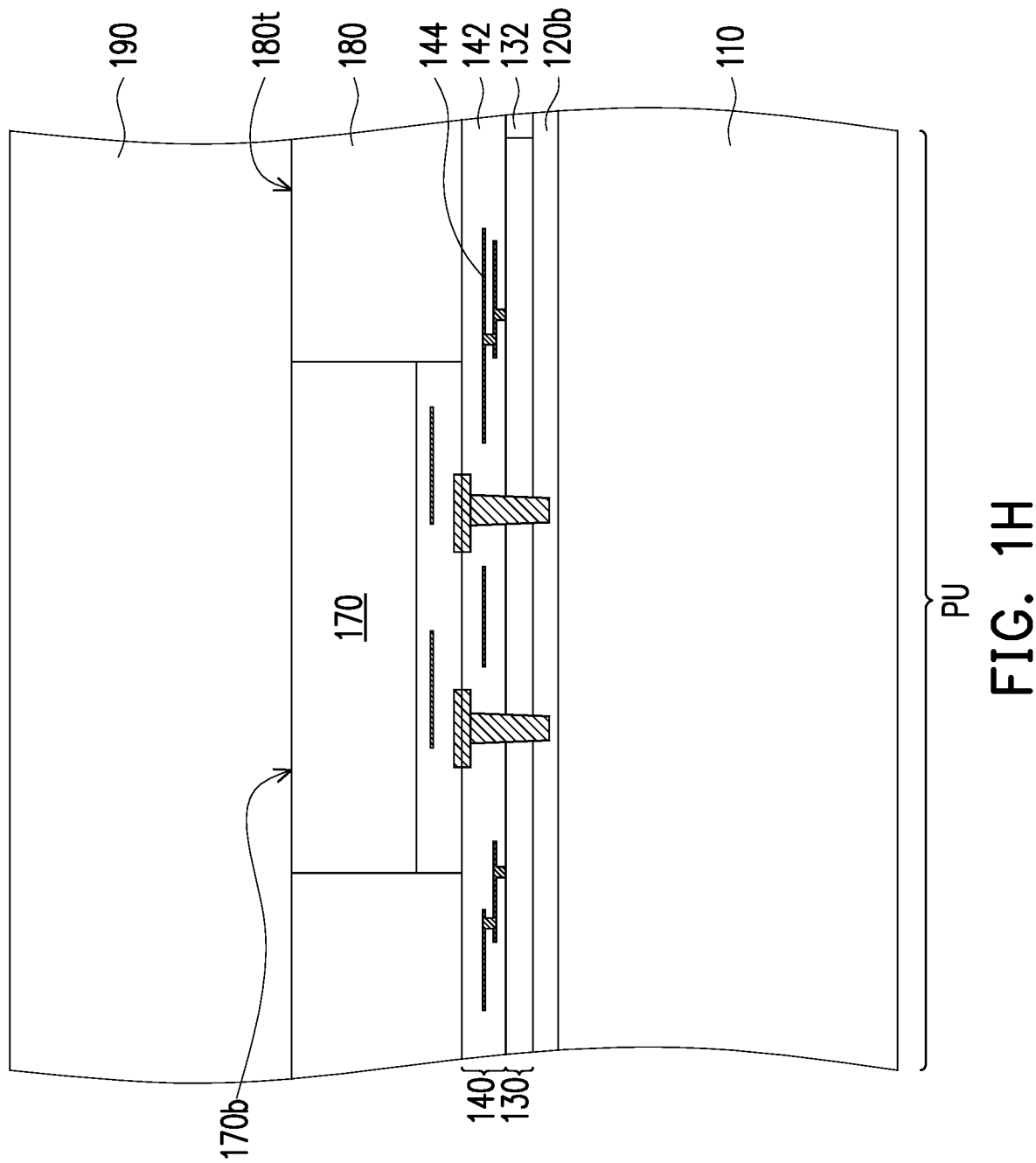

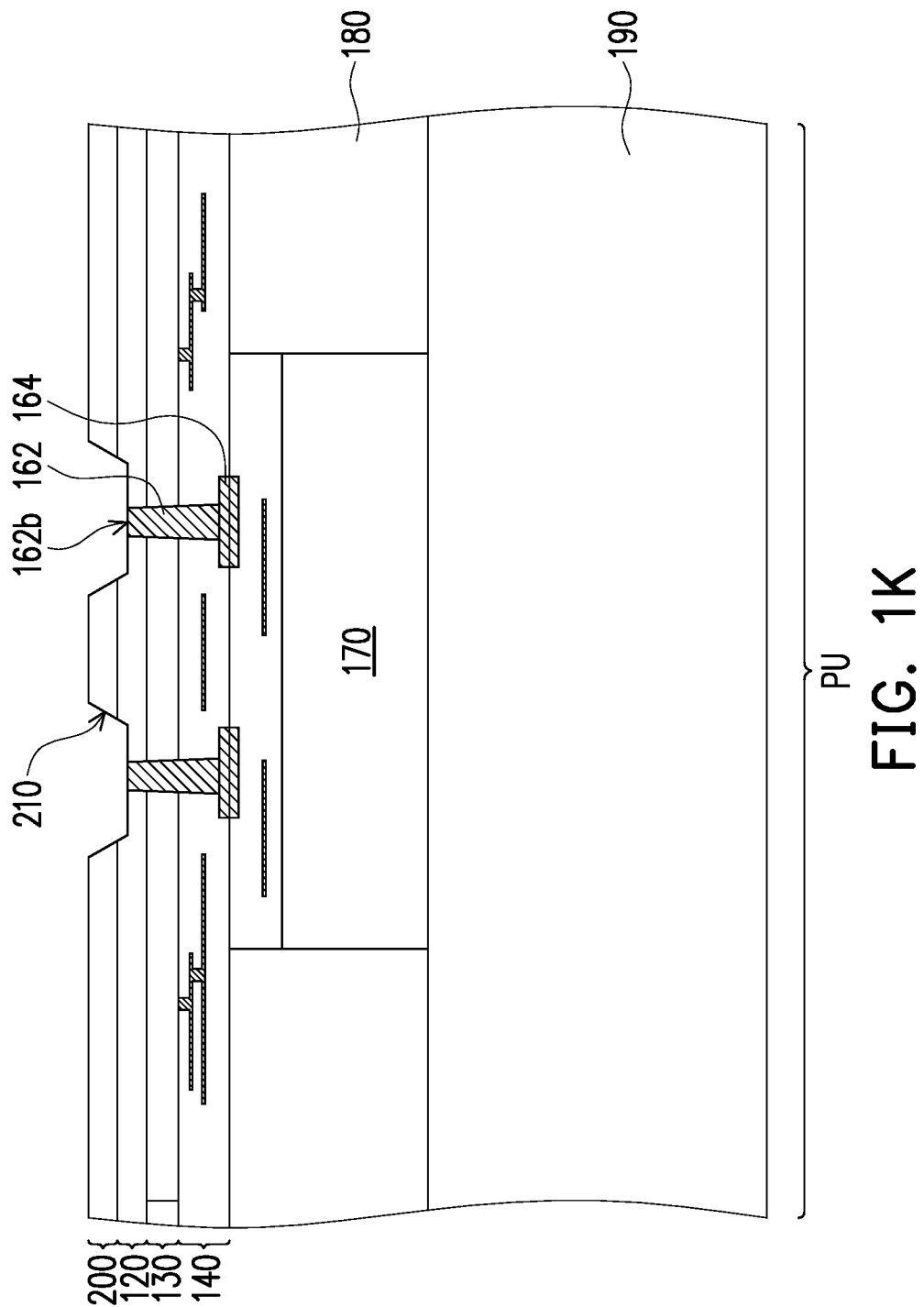

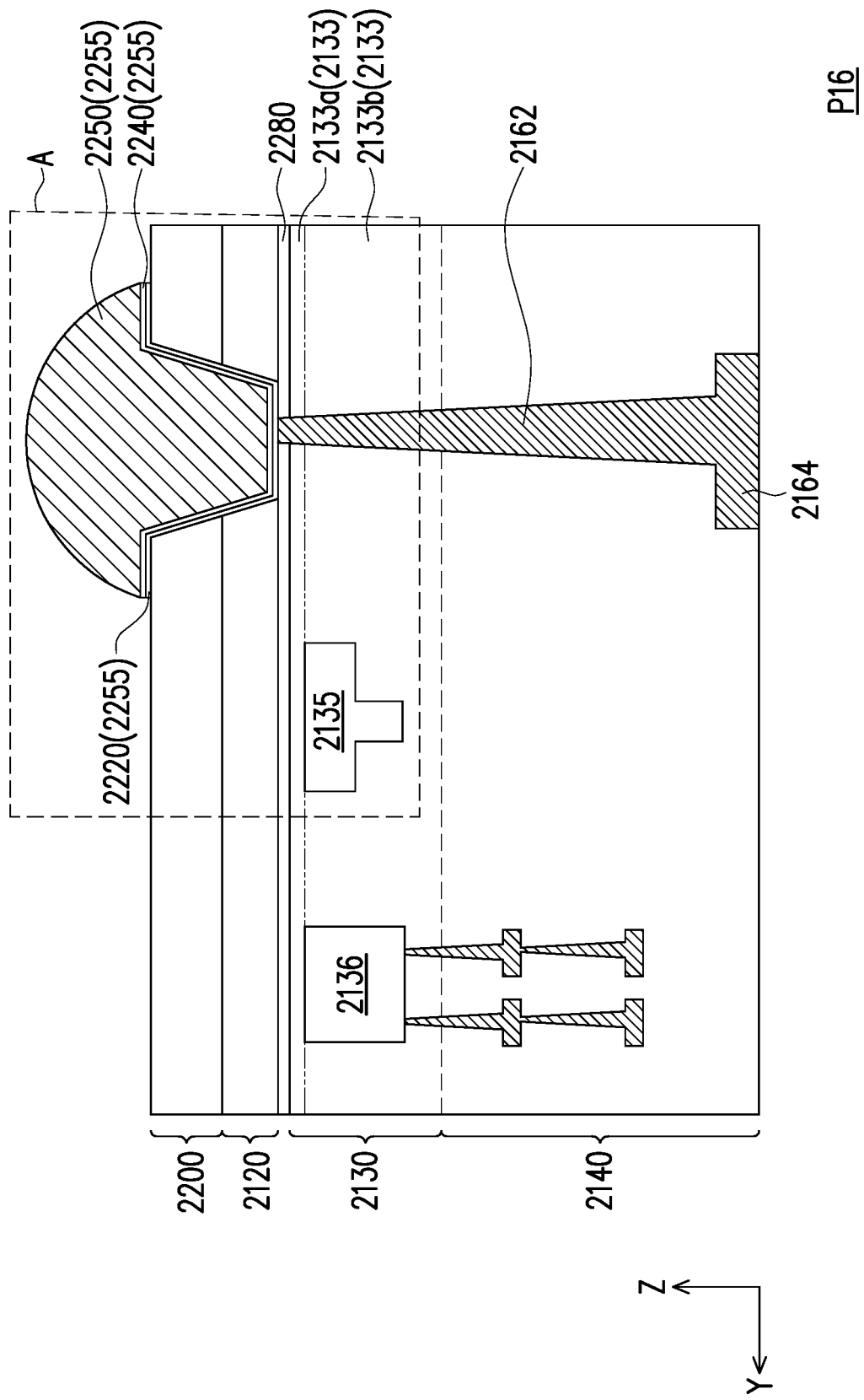

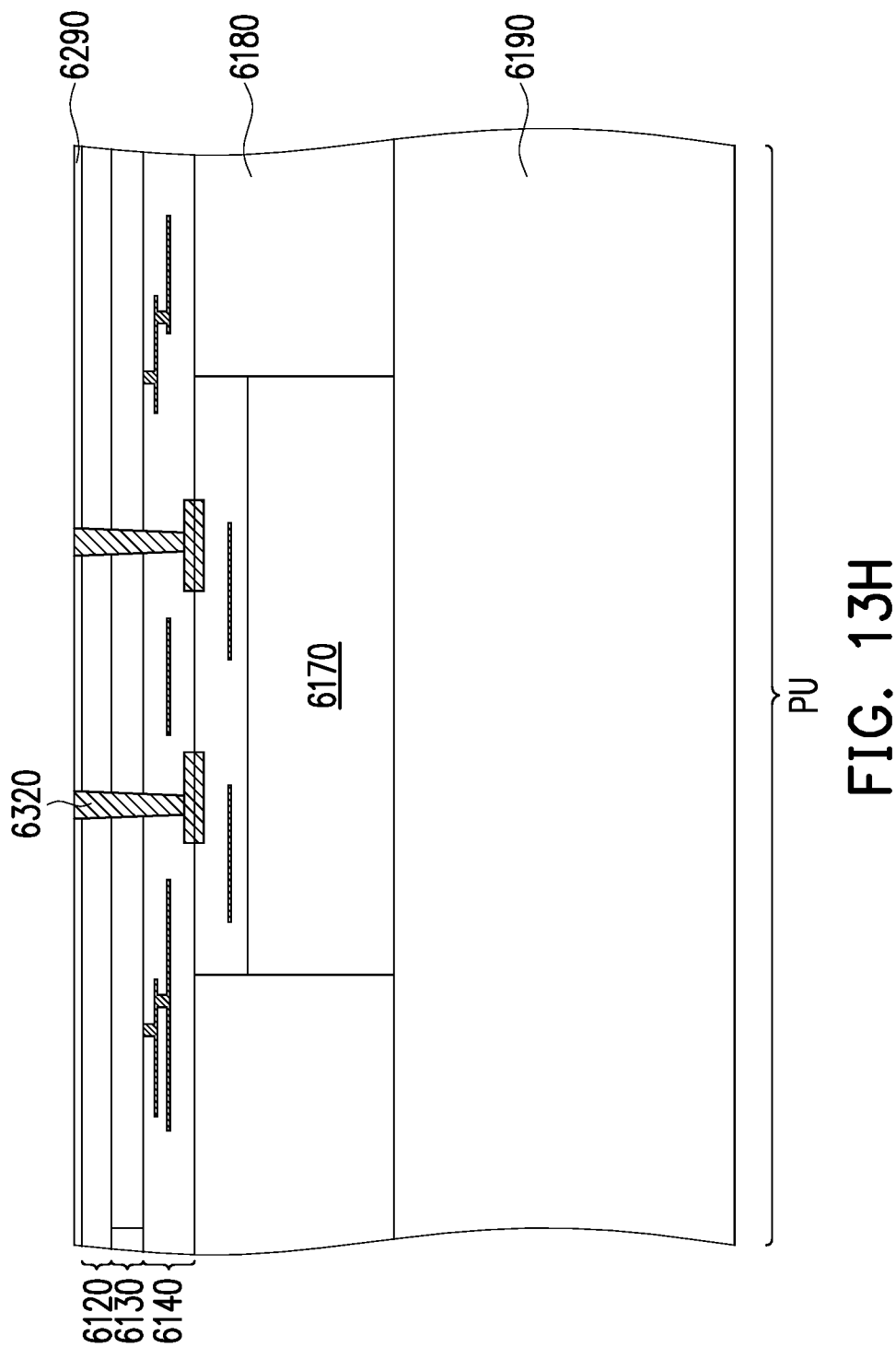

SEMICONDUCTOR PACKAGE AND MANUFACTURING METHOD THEREOF

CROSS-REFERENCE TO RELATED APPLICATION

This application is a divisional application of and claims the priority benefit of a prior application Ser. No. 16/877,498, filed on May 19, 2020. The entirety of the above-mentioned patent application is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for wafer level packaging. Integration of multiple semiconductor devices has become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1M are schematic cross-sectional views illustrating structures formed during a manufacturing process of a semiconductor package in accordance with some embodiments of the disclosure.

FIG. 7A and FIG. 7B are schematic cross-sectional views of a portion of a semiconductor package in accordance with some embodiments of the disclosure.

FIG. 13A to FIG. 13I are schematic cross-sectional views illustrating structures formed during a manufacturing process of a semiconductor package in accordance with some embodiments of the disclosure.

DETAILED DESCRIPTION

Figure 1A:
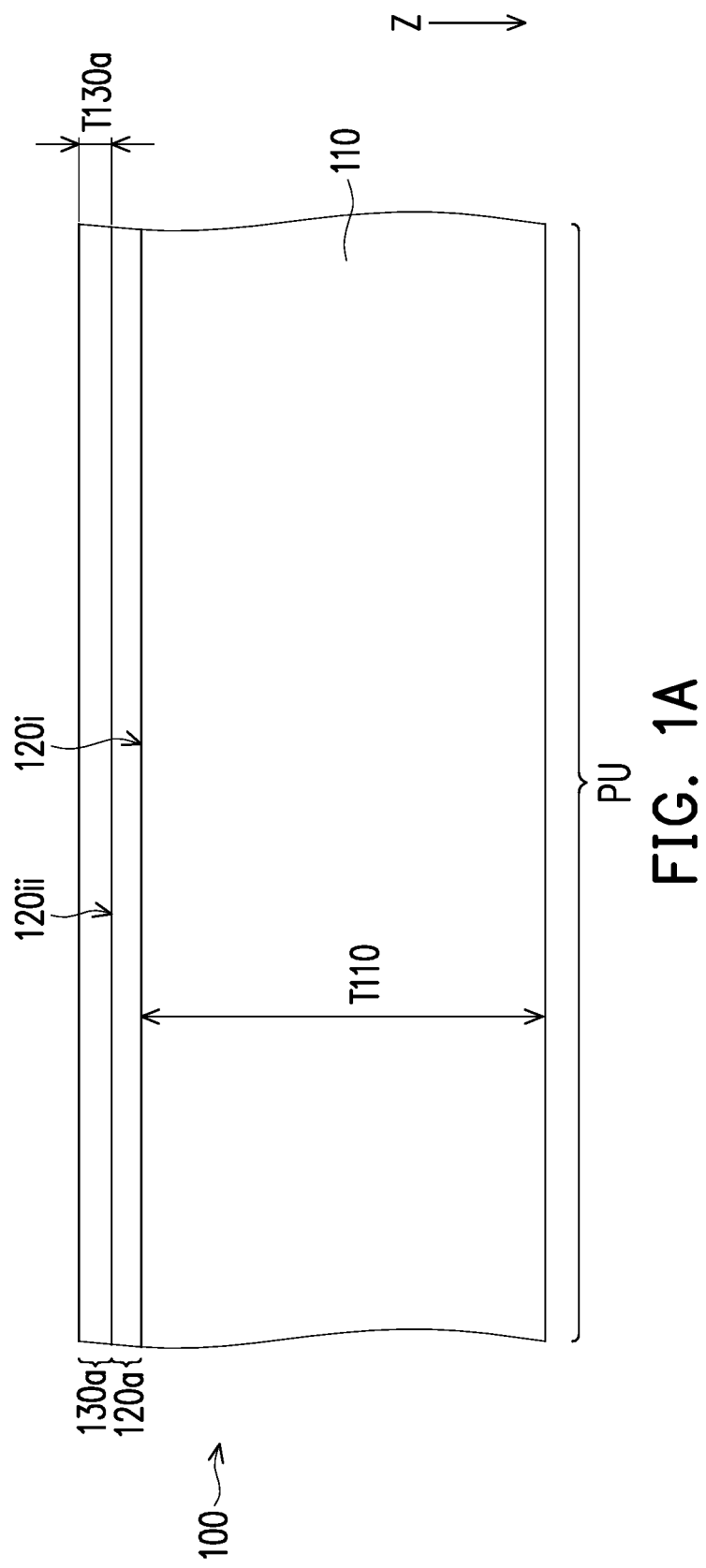

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1M are schematic cross-sectional views illustrating a manufacturing process of a semiconductor package P10 in accordance with some embodiments of the disclosure. Referring to FIG. 1A, a substrate 100 is provided. In some embodiments, the substrate 100 is a semiconductor-on-insulator wafer, including a bulk semiconductor layer 110, an insulator layer 120a, and a front semiconductor layer 130a sequentially stacked. In some embodiments, the thickness T110 of the bulk semiconductor layer 110 is larger than the thickness T130a of the front semiconductor layer 130a, so as to facilitate handling of the substrate 100. Both thicknesses T110 and T130a are measured along a stacking direction of the layers (e.g., the Z direction illustrated in FIG. 1A). The bulk semiconductor layer 110 and the front semiconductor layer 130a include one or more semiconductor materials, which may be elemental semiconductor materials, compound semiconductor materials, or semiconductor alloys. For instance, the elemental semiconductor may include Si or Ge. The compound semiconductor materials and the semiconductor alloys may respectively include SiGe, SiC, SiGeC, a III-V semiconductor or a II-VI semiconductor. For instance, the III-V semiconductor includes GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, or InAlPAs. The II-VI semiconductor may include CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, or HgZnSTe. In some embodiments, the bulk semiconductor layer 110 and the front semiconductor layer 130a include the same material. In some alternative embodiments, the bulk semiconductor layer 110 and the front semiconductor layer 130a include different materials.

The insulator layer 120a separates the front semiconductor layer 130a from the bulk semiconductor layer 110. The insulator layer 120a may have a first surface 120i in contact with the bulk semiconductor layer 110 and a second surface 120ii opposite to the first surface 120i facing the front semiconductor layer 130a. In some embodiments, the second surface 120ii may be in contact with the front semiconductor layer 130a. In some embodiments, the insulator layer 120a includes dielectric materials. For example, the insulator layer 120a may include an oxide such as silicon oxide, and may be referred to as a buried oxide layer (BOX). In some embodiments, the substrate 100 may be prepared according to any one of a number of suitable approaches. For example, oxygen ions may be implanted in a semiconductor wafer, followed by an annealing step to repair damages which the implantation stage may have caused. Alternatively, a first semiconductor wafer may be bonded to an oxidized surface of a second semiconductor wafer. The first semiconductor wafer may be subsequently thinned to the desired thickness, for example through a sequence of grinding and polishing steps. Alternative processes, for example involving combinations of wafer bonding, splitting, and/or ion implantation are also possible, and are contemplated within the scope of the disclosure.

In some embodiments, the substrate 100 is in wafer form. That is, different regions of the wafer may correspond to different package units PU, so that multiple package units PU may be simultaneously manufactured from the same wafer. In the drawings, an individual package unit PU is shown for illustration purposes, however, multiple package units PU may be formed in the substrate 100, and processed together with wafer-level technology.

Figure 1B:
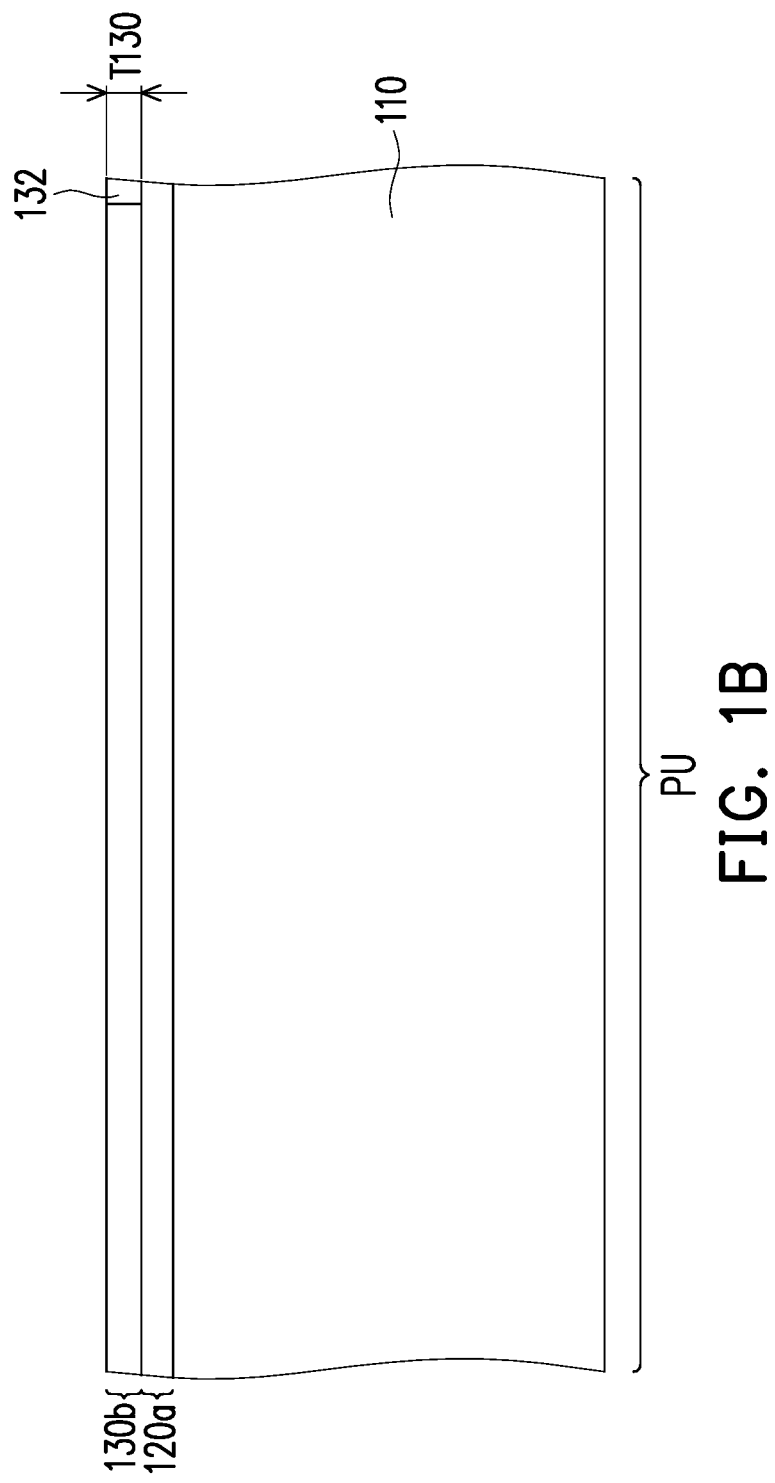

Referring to FIG. 1A and FIG. 1B, a device layer 130b may be formed from the front semiconductor layer 130a. For example, the front semiconductor layer 130a may be patterned to form one or more devices and one or more waveguide patterns. One or more ion implantation processes may also be performed in one or more regions of the front semiconductor layer 130a to form the devices. Insulating materials (e.g., oxides) may be disposed on the patterned front semiconductor layer 130a to form waveguides in the device layer 130b. In some embodiments, one of the waveguides may be disposed towards the edge of the package unit PU, so as to be configured to act as mode coupler 132. In some embodiments, the mode coupler 132 is an edge coupler. In view of the processes involved in the formation of the device layer 130b, the thickness T130 of the device layer 130b may vary with respect to the original thickness T130a of the front semiconductor layer 130a.

Figure 1C:
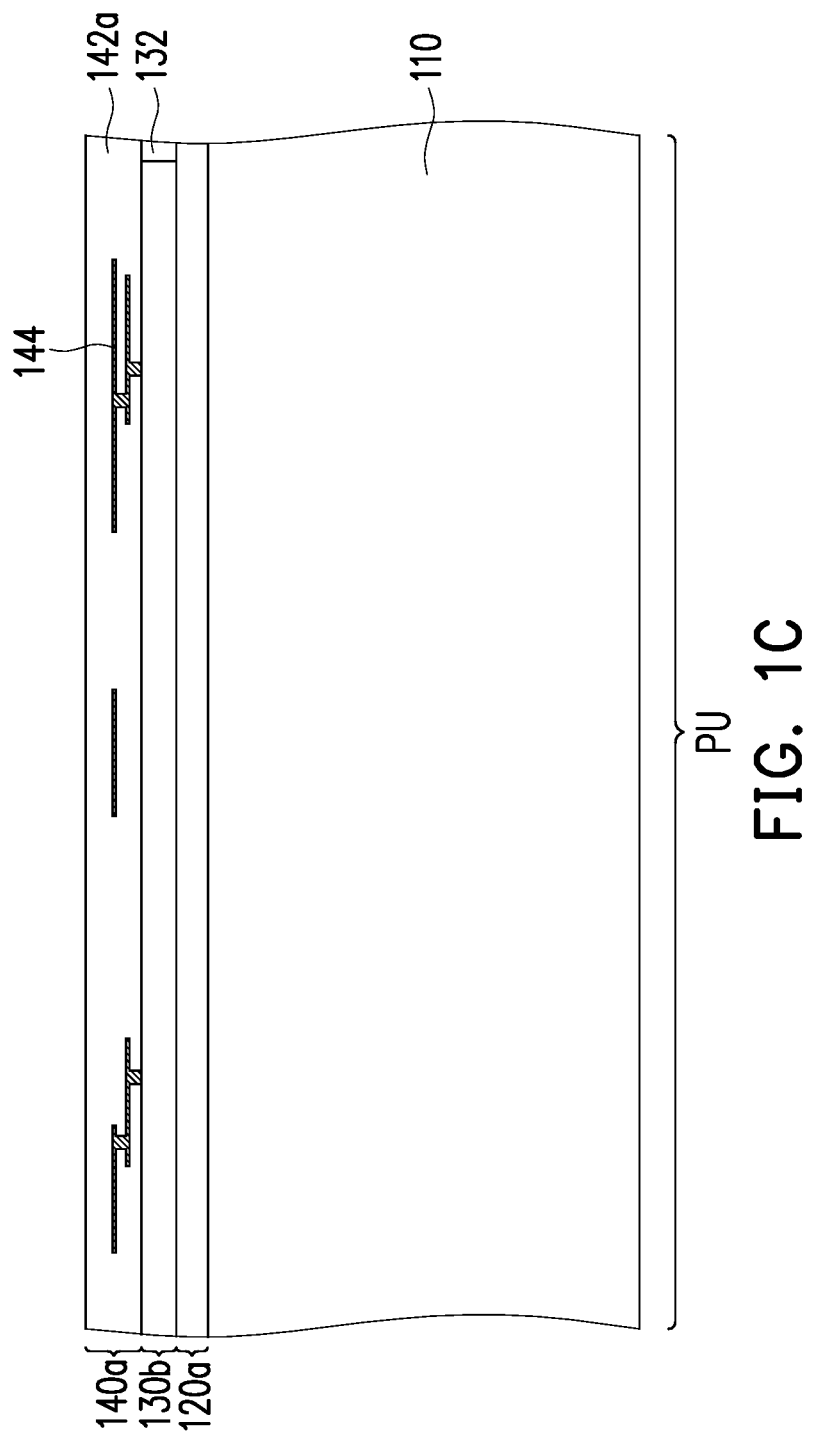

Referring to FIG. 1C, in some embodiments an interconnection structure 140a is formed on the device layer 130b. In some embodiments, the interconnection structure 140a includes a dielectric layer 142a and patterned conductive traces 144 embedded in the dielectric layer 142a. Even though the dielectric layer 142a is shown as a single layer, in practice it may comprise a plurality of stacked dielectric layers. In some embodiments, the patterned conductive traces 144 are arranged in one or more metallization tiers alternately stacked with dielectric layers of the dielectric layer 142a. In some embodiments, patterned conductive traces 144 of different metallization tiers may extend through the dielectric layer 142a to establish electrical connection between devices formed in the device layer 130b. In some embodiments, a material of the dielectric layer 142a includes polyimide, epoxy resin, acrylic resin, phenol resin, benzocyclobutene (BCB), polybenzooxazole (PBO), combinations thereof, or other suitable dielectric materials. The dielectric layer 142a may be formed by suitable fabrication techniques such as spin-on coating, lamination, chemical vapor deposition (CVD), or the like. In some embodiments, a material of the patterned conductive traces 144 includes aluminum, titanium, copper, nickel, tungsten, and/or alloys thereof. The patterned conductive traces 144 may be formed by, for example, electroplating, deposition, and/or photolithography and etching. In some embodiments, the interconnection structure 140a is formed by sequential CVD and dual damascene processes. In some embodiments, the number of metallization tiers and dielectric layers in the interconnection structure 140a may be adjusted depending on the routing requirements.

Figure 1D:
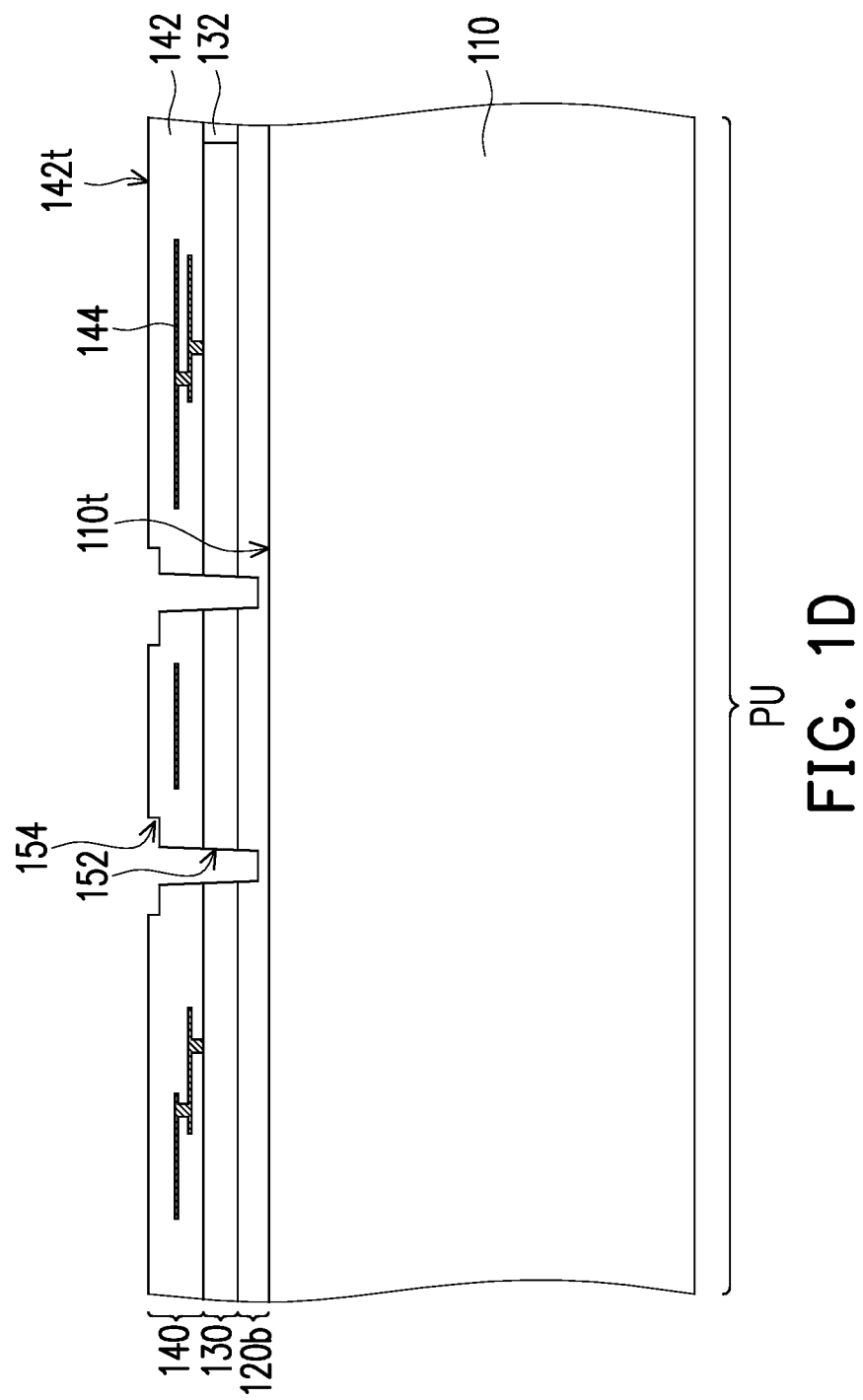

Referring to FIG. 1D, in some embodiments, via openings 152 and trenches 154 may be opened in the dielectric layer 142a, for example via a sequence of etching steps according to a damascene process. The trenches 154 may be formed in correspondence of the top surface 142t (the distal surface with respect to the bulk semiconductor layer 110), and the via openings 152 may vertically extend from the trenches towards the bulk semiconductor layer 110. In some embodiments, the via openings 152 penetrate through the device layer 130 and partially extend within the insulator layer 120b. In some embodiments, the via openings 152 terminate in the insulator layer 120b, stopping short of reaching the bulk semiconductor layer 110. That is, the top surface of the bulk semiconductor layer 110 may still be completely covered by the insulator layer 120b. In some embodiments, the depth of the via openings 152 may be set by control of the etching conditions (e.g., reaction time). Referring to FIG. 1E, bonding vias 162 and bonding pads 164 are formed, for example, by depositing a conductive material in the via openings 152 and the trenches 154, respectively. In some embodiments, the bonding vias 162 and the bonding pads 164 are formed by simultaneously filling the via openings 152 and the overlying trenches 154 to which the via openings 152 are connected. However, the disclosure is not limited thereto. In some alternative embodiments, the bonding vias 162 may be formed in the interconnection structure 140 before the bonding pads 164. An additional bonding dielectric layer (not shown) may be formed on the interconnection structure 140 and the bonding vias 162, and the bonding pads 164 may be formed on the bonding vias 162 in the additional bonding dielectric layer. In some embodiments, one end 162a of a bonding via 162 contacts the overlying bonding pad 164, and the opposite end 162b of the same bonding via 162 is buried in the insulator layer 120b. In some embodiments, a width of a bonding pad 164 may be greater than a width of the underlying bonding via 162. In some embodiments, some of the bonding vias 162 may land on the patterned conductive traces 144, establishing electrical connection between the corresponding bonding pads 164 and the devices of the device layer 130. In some embodiments, the bonding vias 162 and the bonding pads 164 include the same material. Materials for the bonding vias 162 and the bonding pads 164 include, for example, aluminum, titanium, copper, nickel, tungsten, or alloys thereof. In some embodiments, the bonding vias 162 and the bonding pads 164 may be collectively referred to as bonding conductive patterns 160. As illustrated in FIG. 1E, the top surface 142t of the dielectric layer 142 and the top surfaces 164a of the bonding pads 164 may be collectively referred to as an active surface AS1. As illustrated in FIG. 1E, the top surface 142t of the dielectric layer 142 and the top surfaces 164a of the bonding pads 164 are substantially located at the same level height along the Z direction to provide an appropriate active surface AS1 for hybrid bonding.

Figure 1F:
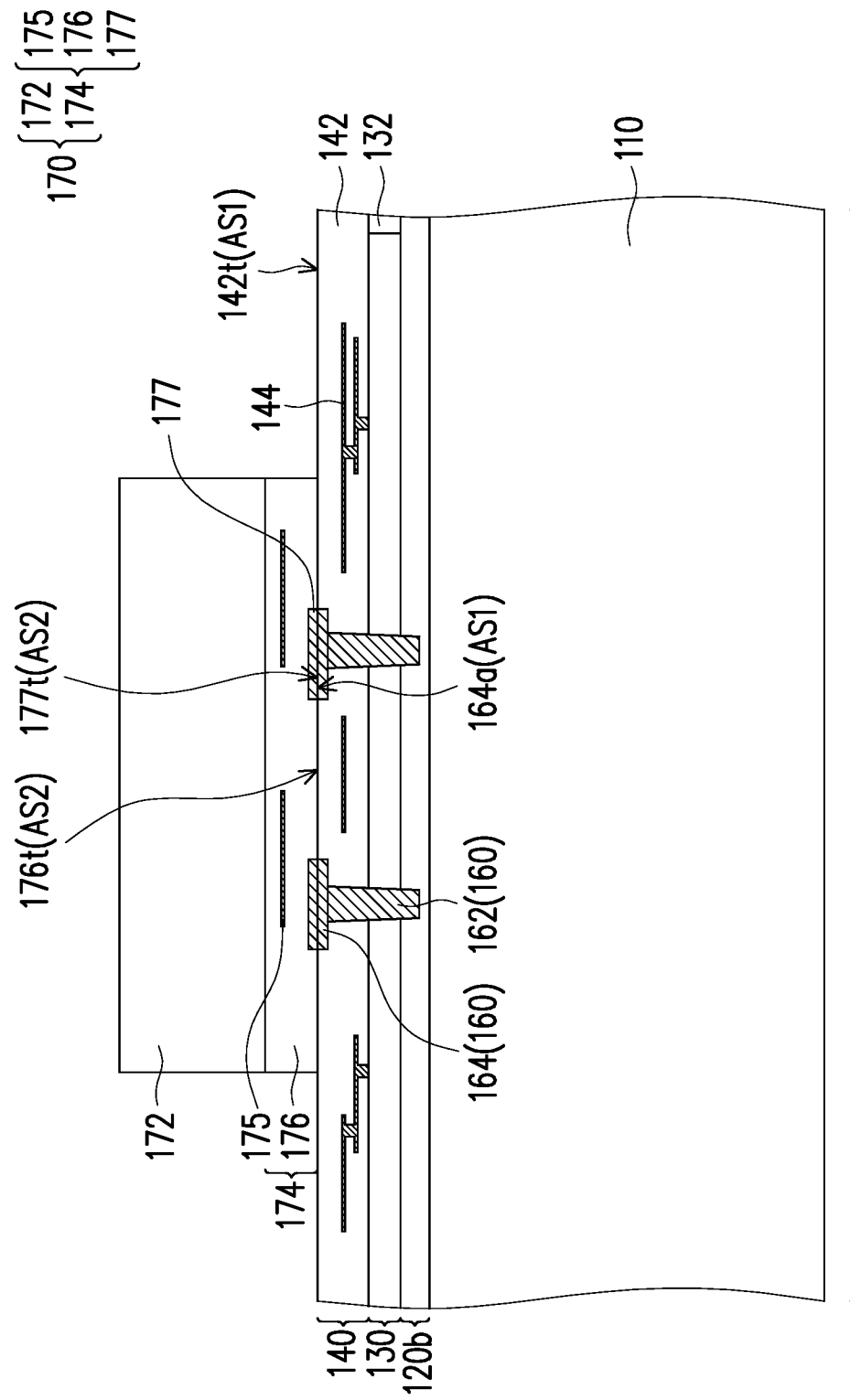

Referring to FIG. 1F, semiconductor dies 170 are provided on the active surfaces AS1 of the package units PU. In some embodiments, one or more semiconductor dies 170 may be disposed in a single package unit PU, according to design requirements. The semiconductor dies 170 disposed in a package unit PU may be of the same type or perform the same function, but the disclosure is not limited thereto. In some alternative embodiments, the semiconductor dies 170 disposed in a same package unit PU may be different from each other, or perform different functions.

Briefly, a semiconductor die 170 may include a semiconductor substrate 172 and an interconnection structure 174 disposed on the semiconductor substrate 172. The interconnection structure 174 may include patterned conductive traces 175 embedded in a dielectric layer 176, and bonding pads 177 exposed at a top surface 176t of the dielectric layer 176. The patterned conductive traces 175 may be electrically connected to active devices formed in the semiconductor substrate 172. In some embodiments, the patterned conductive traces 175 vertically extend through the dielectric layer 176 to connect the devices in the semiconductor substrate 172 to the bonding pads 177. In some embodiments, top surfaces 177t of the bonding pads 177 and the top surface 176t of the dielectric layer 176 are part of the active surface AS2 of the semiconductor die 170.

As illustrated in FIG. 1F, the semiconductor dies 170 are bonded to the interconnection structure 140. In some embodiments, the semiconductor dies 170 may be bonded to the interconnection structure 140 through a hybrid bonding process. In some embodiments, the semiconductor dies 170 may be picked-and-placed onto the active surfaces AS1 of the interconnection structure 140 such that the active surfaces AS2 of the semiconductor dies 170 are in contact with the active surface AS1 of the interconnection structure 140. Furthermore, the bonding pads 177 of the semiconductor dies 170 are substantially aligned and in direct contact with the corresponding bonding pads 164 of the interconnection structure 140 and the dielectric layer 176 is directly in contact with at least a portion of the dielectric layer 142. In some embodiments, the footprint of a semiconductor die 170 is smaller than a span of the package unit PU. That is, even after placement of the semiconductor dies 170, portions of the dielectric layer 142 within a package unit PU may be left exposed. In some embodiments, to facilitate the hybrid bonding between the semiconductor dies 170 and the interconnection structure 140, surface preparation for the surfaces to be bonded (i.e. the active surfaces AS1 and the active surfaces AS2) may be performed. The surface preparation may include surface cleaning and activation, for example.

After cleaning the active surfaces AS1 and AS2, activation of the bonding surfaces of the dielectric layers 142 and 176 may be performed for development of high bonding strength. For example, plasma activation may be performed to treat the top surfaces 142t and 176t of the dielectric layers 142 and 176. After the activated top surfaces 142t and 176t of the dielectric layers 142 and 176 are in contact with each other, a hybrid bonding step is performed. The hybrid bonding step may include a thermal treatment for dielectric bonding and a thermal annealing for conductor bonding. In some embodiments, the process temperature of the thermal annealing for conductor bonding is higher than that of the thermal treatment for dielectric bonding. After performing the thermal annealing for conductor bonding, the dielectric layer 142 is bonded to the overlying dielectric layer 176, and the bonding pads 177 are bonded to the underlying bonding pads 164. As such, in a package unit PU one or more semiconductor dies 170 are hybrid bonded to the interconnection structure 140.

Figure 1G:
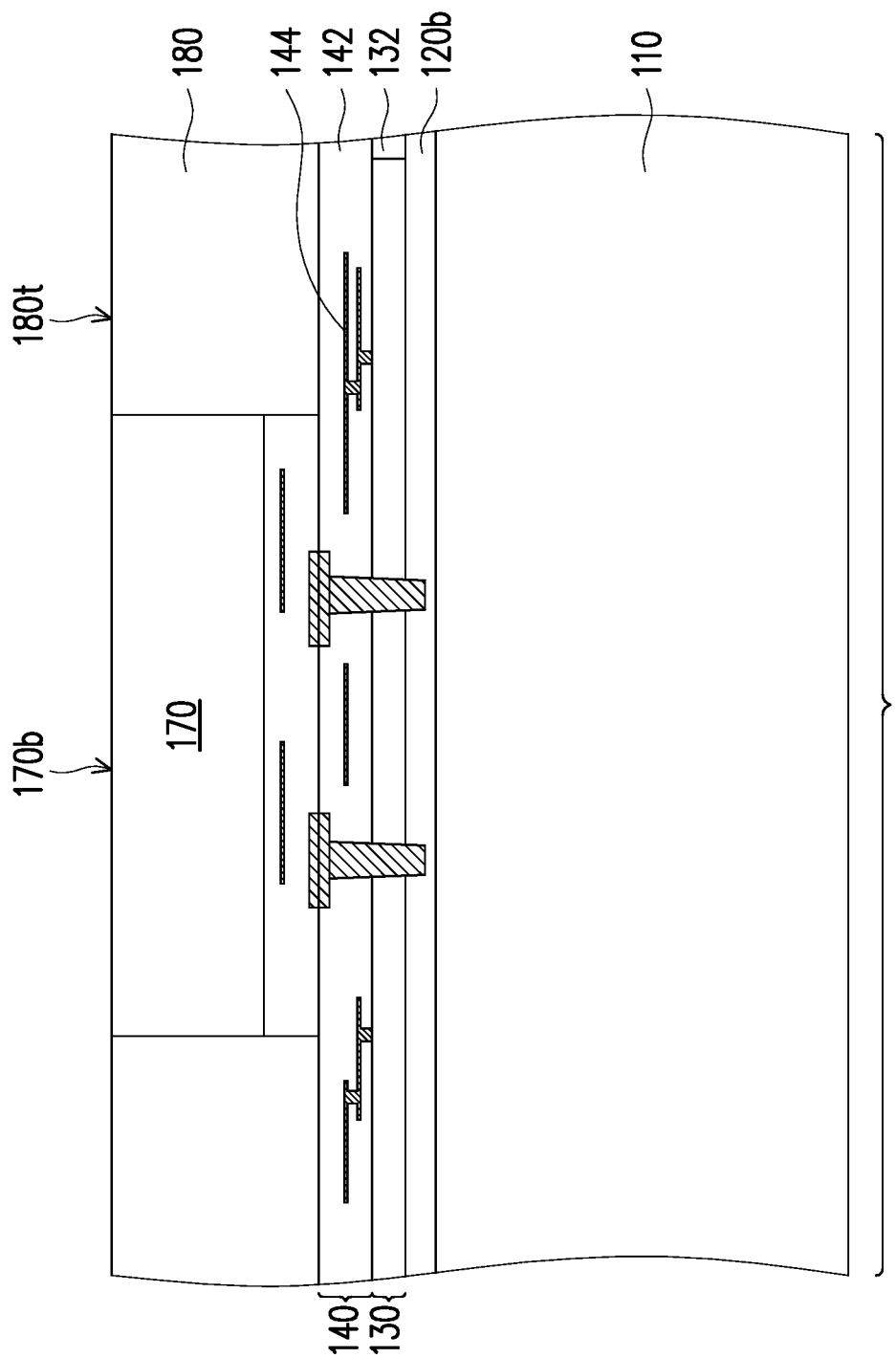

Referring to FIG. 1G, a filling process is performed to form an encapsulant 180 over the interconnection structure 140 to encapsulate the semiconductor dies 170. In some embodiments, the encapsulant 180 may be formed so as to fill gaps between the semiconductor dies 170 over the interconnection structure 140. In some embodiments, the encapsulant 180 may be formed to be substantially level with the backside surfaces 170b of the semiconductor dies 170. That is, the top surface 180t of the encapsulant 180 may be at substantially the same level height as the backside surfaces 170b. However, the disclosure is not limited thereto. In some alternative embodiments, the encapsulant 180 may cover the backside surfaces 170b of the semiconductor dies 170. In some embodiments, a material of the encapsulant 180 includes inorganic materials such as silicon oxide, silicon nitride, or the like. In some alternative embodiments, a material of the encapsulant 180 includes a molding compound, a polymeric material, such as polyimide, epoxy resin, acrylic resin, phenol resin, BCB, PBO, a combination thereof, or other suitable polymer-based dielectric materials. In some embodiments, the encapsulant 180 may be formed by suitable processes, such as CVD, plasma-enhanced chemical vapor deposition (PECVD), atomic layer deposition (ALD), or the like.

Referring to FIG. 1H, an auxiliary carrier 190 is provided on the top surface 180t of the encapsulant and the backside surface 170b of the semiconductor die 170. In some embodiments, the auxiliary carrier 190 may be a semiconductor wafer, similar to what was previously described with reference to the bulk semiconductor layer 110. In some embodiments, the auxiliary carrier 190 may be secured to the package unit PU, for example through an interposed layer of adhesive material (not shown).

Figure 1I:
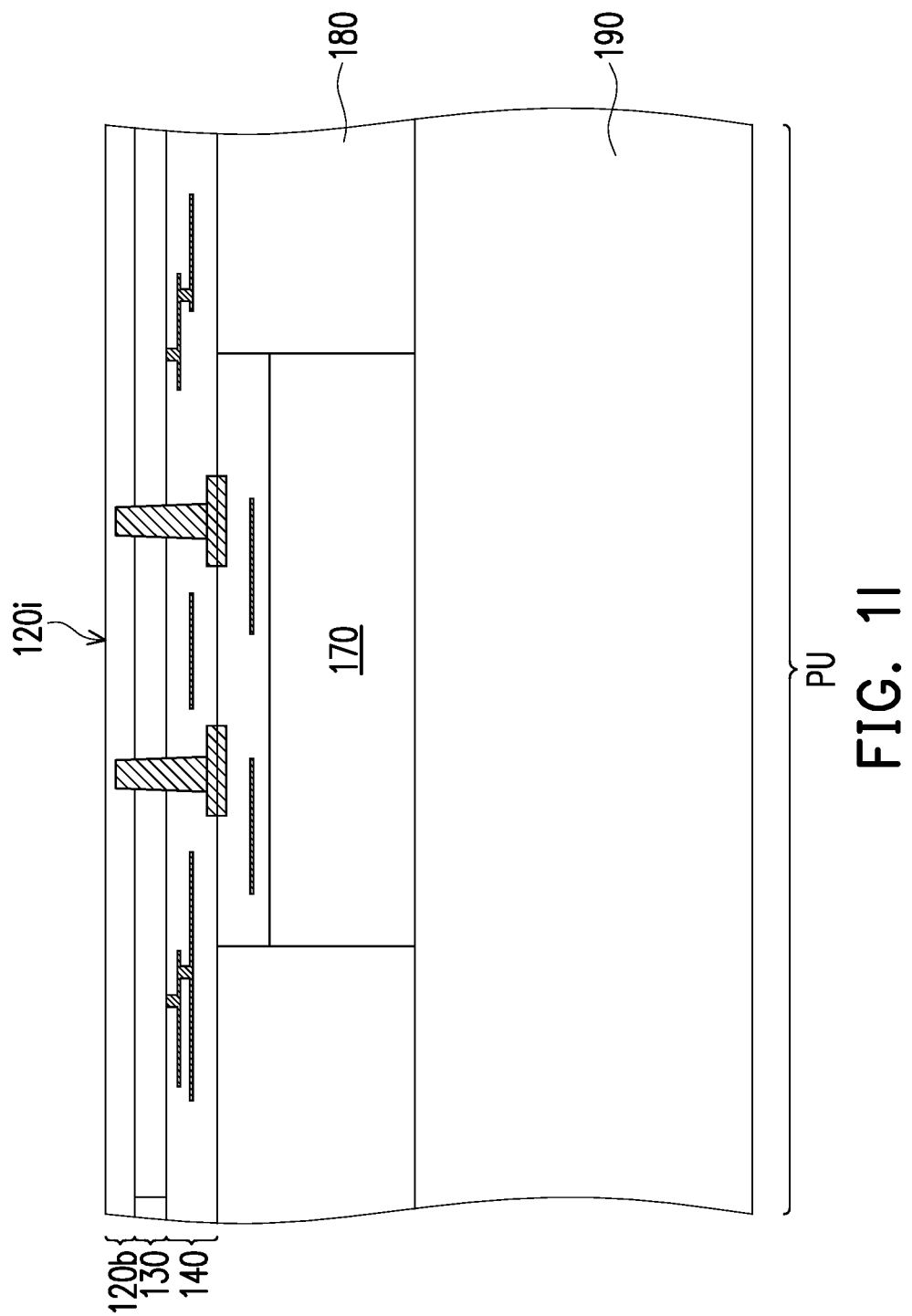

Referring to FIG. 1H and FIG. 1I, in some embodiments the system may be overturned, and the bulk semiconductor layer 110 may be removed, for example via chemical mechanical polishing (CMP) or etching. Following removal of the bulk semiconductor layer 110, the first surface 120i of the insulator layer 120b is exposed and available for further processing.

Figure 1J:
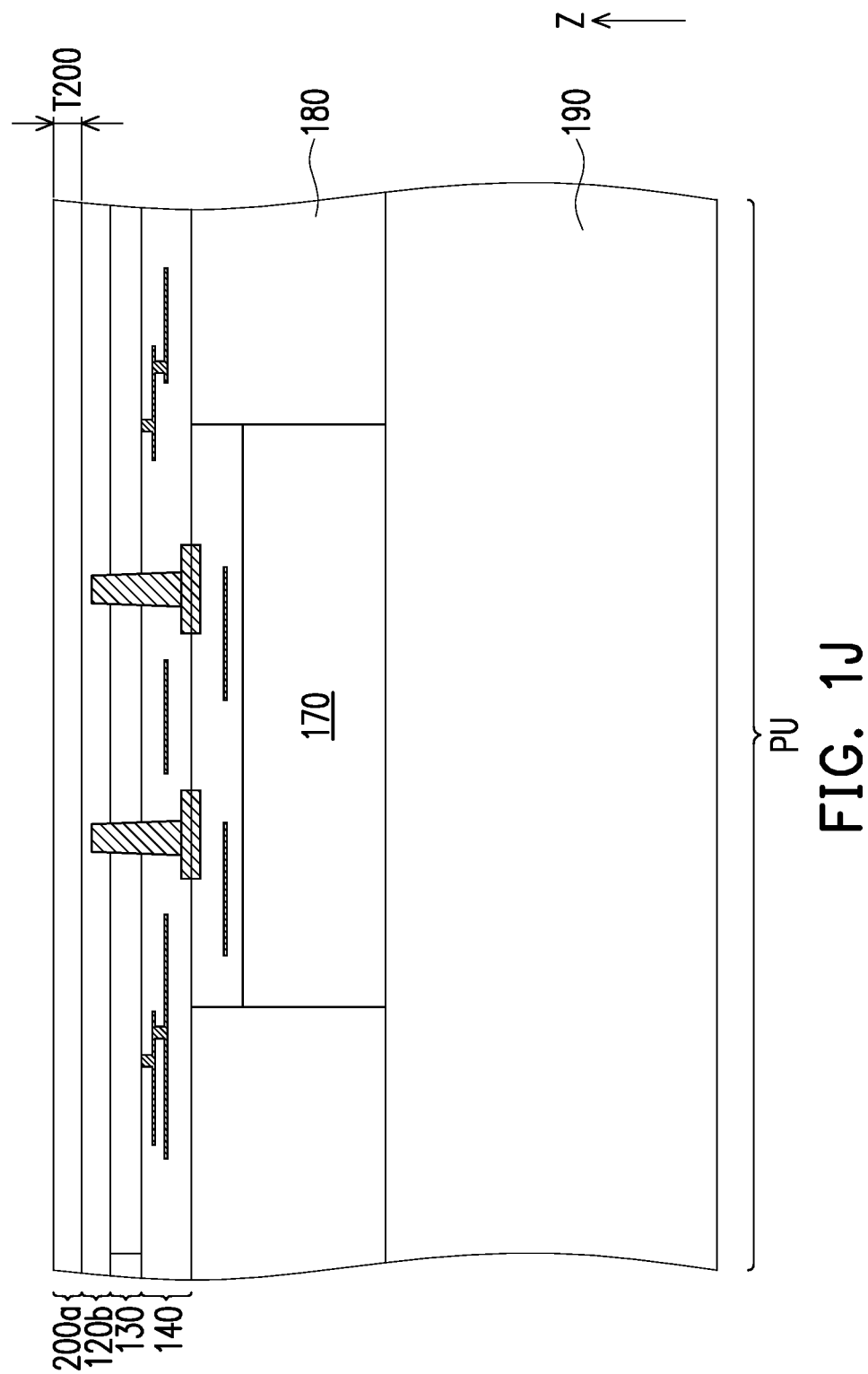

Referring to FIG. 1J, a buffer layer 200a is formed on the insulator layer 120b. In some embodiments, the buffer layer 200a blanketly covers the insulator layer 120b. A thickness T200 along the Z direction of the buffer layer 200a is not particularly limited, and may be selected, for example, as a function of the size of the optical components (e.g., optical fibers) to which the finished semiconductor package is going to be coupled. In some embodiments, the buffer layer 200a may be at least 10 micrometers thick. In some embodiments, the buffer layer 200a includes dielectric materials, such as oxides. For example, the buffer layer 200a may include silicon oxide. In some embodiments, the buffer layer 200a may include the same material as the insulator layer 120b. In some alternative embodiments, the buffer layer 200a and the insulator layer 120b may include different materials. In some embodiments, the material of the buffer layer 200a may be selected so as to match the coefficient of thermal expansion of the successively formed connective terminals (illustrated, e.g., in FIG. 1M). In some embodiments, the refractive index of the buffer layer 200a at the operative wavelength of the semiconductor package may be in the range between the refractive index of air and the refractive index of silicon oxide. In some embodiments, the buffer layer 200a may be formed by suitable processes, such as CVD, plasma-enhanced chemical vapor deposition (PECVD), atomic layer deposition (ALD), or the like.

Figure 1L:
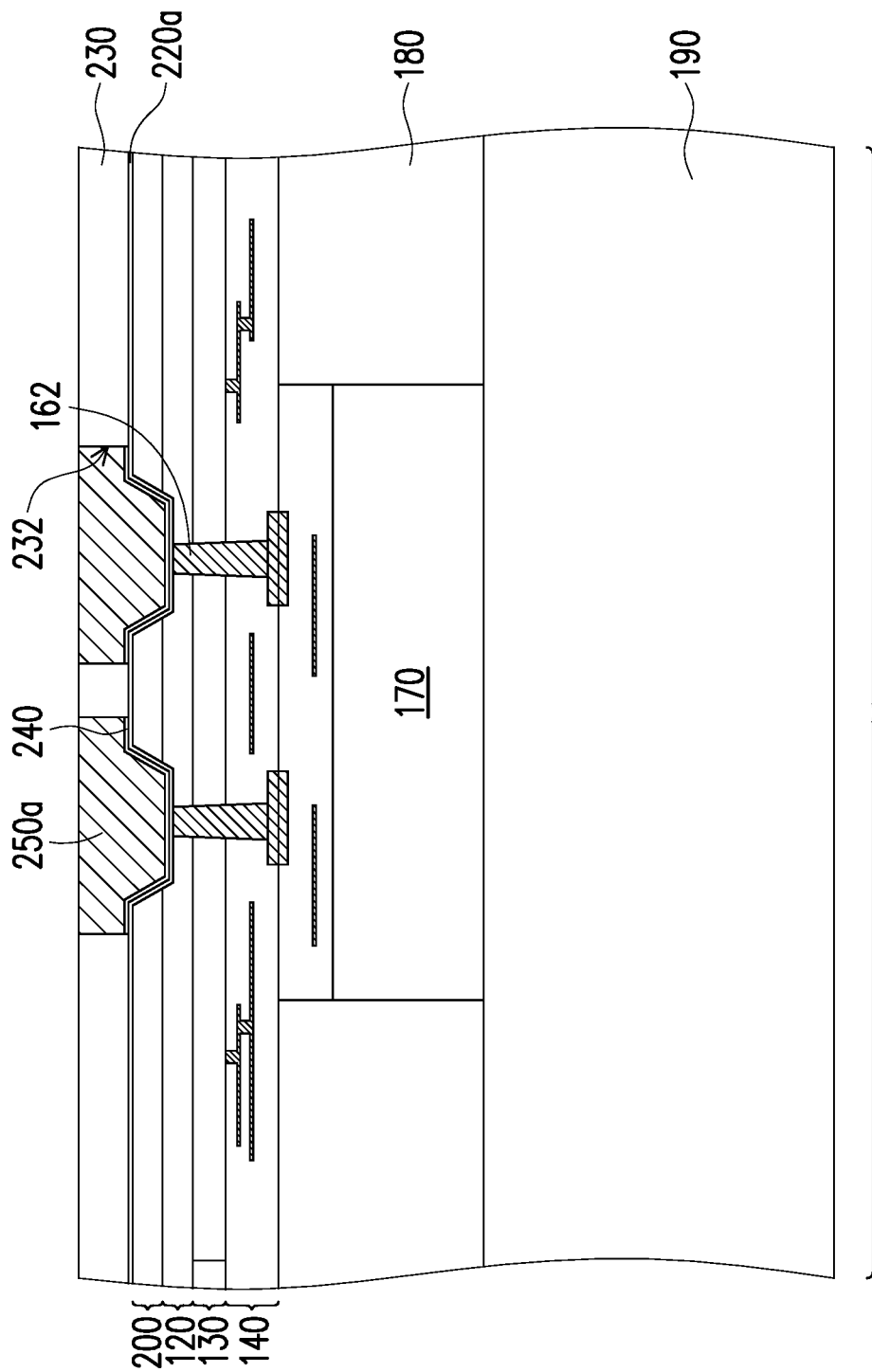

Referring to FIG. 1J and FIG. 1K, contact openings 210 are formed in the buffer layer 200a and the insulator layer 120b. The contact openings 210 may expose at their bottom the end 162b of the bonding vias 162 further away from the bonding pads 164. In some embodiments, the contact openings 210 may be formed via an etching step. Auxiliary masks (not shown) may be used to determine the position and size of the contact openings 210. Referring to FIG. 1K and FIG. 1L, a seed material layer 220a is provided over the bonding vias 162 and the buffer layer 200. In some embodiments, the seed material layer 220a further extends on the insulator layer 10 at the bottom of the contact openings 210. In some embodiments, the seed material layer 220a is blanketly formed over the package unit PU. In some embodiments, the seed material layer 220a establishes electrical contact to the bonding vias 162 at the bottom of the contact openings 210. The seed material layer 220a may be formed through, for example, a sputtering process, a physical vapor deposition (PVD) process, or the like. In some embodiments, the seed material layer 220a may include, for example, copper, tantalum, titanium, a combination thereof, or other suitable materials. In some embodiments, a barrier layer (not shown) may be deposited before forming the seed material layer 220a to prevent out-diffusion of the material of the seed material layer 220a.

An auxiliary mask 230 may be provided over the seed material layer 220a. In some embodiments, the auxiliary mask 230 is patterned so as to cover only part of the seed material layer 220a. The auxiliary mask 230 includes openings 232 through which portions of the seed material layer 220a are exposed. In some embodiments, the portions of seed material layer 220a exposed by the auxiliary mask 230 lie over the bonding vias 162. In some embodiments, the portions of seed material layer 220a exposed by the auxiliary mask 230 further extends over the buffer layer 200 and the insulator layer 120. In some embodiments, the auxiliary mask 230 is produced by a sequence of deposition, exposure, and development steps. A material of the auxiliary mask 230 may include a positive photoresist or a negative photoresist. In some embodiments, under-bump metallurgies 240 may be conformally formed on the seed material layer 220a in the openings 232. In some embodiments, a material of the under-bump metallurgies 240 includes copper, nickel, tin, palladium, gold, titanium, aluminum, or alloys thereof. In some embodiments, multiple layers of conductive material may be stacked to form the under-bump metallurgies 240. In some embodiments, the under-bump metallurgies 240 may be formed by a plating process. The plating process is, for example, electro-plating, electroless-plating, immersion plating, or the like.

In some embodiments, a solder layer 250a is formed over the seed material layer 220a in the openings 232, on the under-bump metallurgies 240. The solder layer 250a may include eutectic solder containing lead or lead-free. In some embodiments, the solder layer includes Sn, SnAg, SnPb, SnAgCu, SnAgZn, SnZn, SnBiIn, SnIn, SnAu, SnPb, SnCu, SnZnIn, SnAgSb, or similar soldering alloys. In some embodiments, the solder layer 250a includes non-eutectic solder.

Figure 1M:
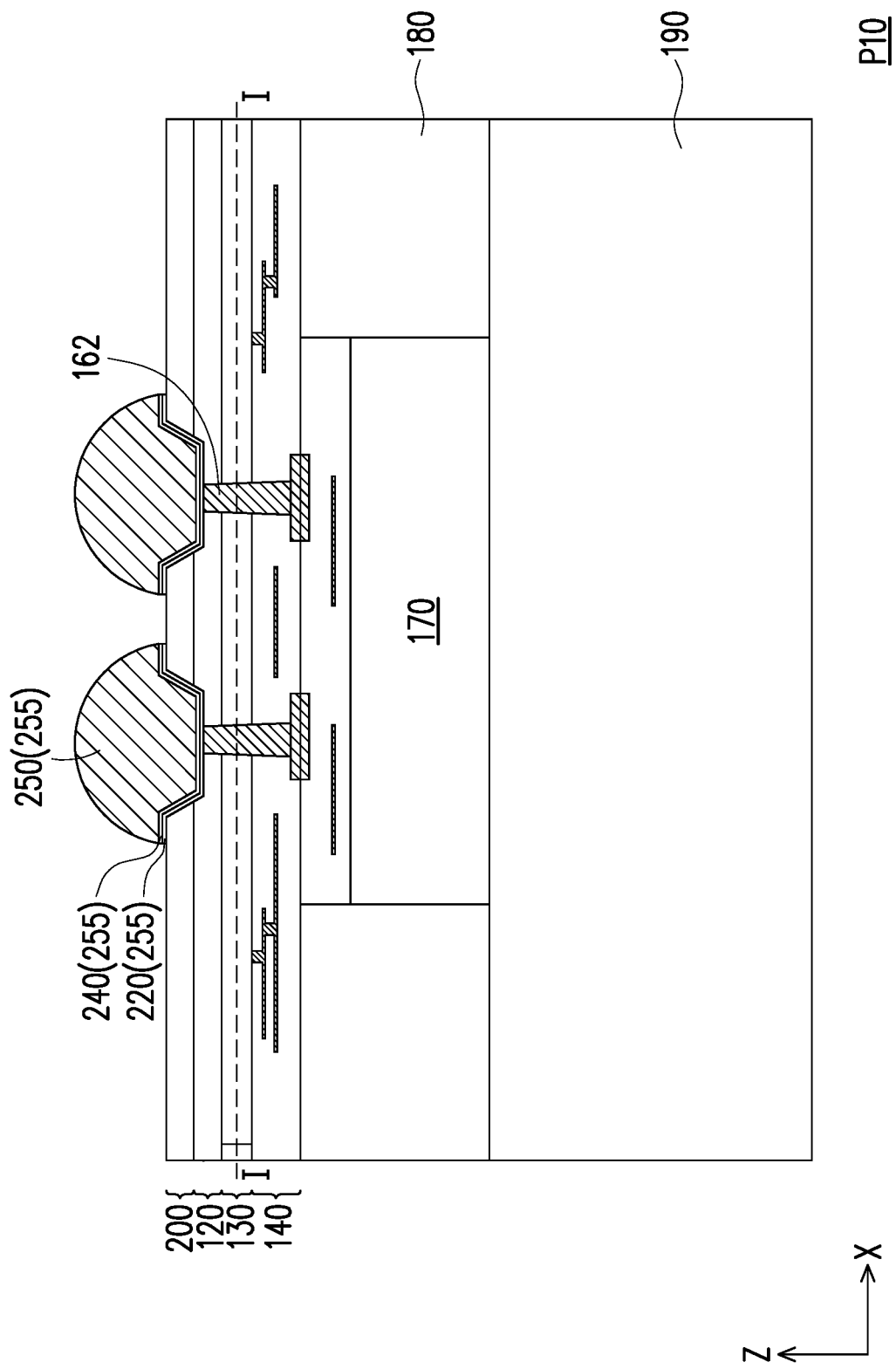

Referring to FIG. 1L and FIG. 1M, the auxiliary mask 230 and the underlying portions of seed material layer 220a may be removed. In some embodiments, the auxiliary mask 230 may be removed or stripped through, for example, etching, ashing, or other suitable removal processes. In some embodiments, the under-bump metallurgies 240 and the solder layer 250a formed in the openings 232 remain after removal of the auxiliary mask 230. Upon removal of the auxiliary mask 230, the portions of seed material layer 220a that are not covered by the under-bump metallurgies 240 and the solder layers 250a are removed to render seed layers 220 disposed between the under-bump metallurgies 240 on one side and the buffer layer 200, the insulator layer 120 and the bonding vias 162 on the opposite side. The exposed portions of the seed material layer 220a may be removed through an etching process. In some embodiments, the material of the solder layers 250a may be different from the material of the seed material layer 220a, so the portions of the seed material layer 220a exposed after removal of the auxiliary mask 230 may be removed through selective etching. Upon removal of the auxiliary mask 230 and the underlying portions of seed material layer 220a, portions of the buffer layer 200 may be exposed.

A reflow process may be performed, to form the bumps 250 from the solder layers 250a. In some embodiments, the bumps 250 may be collectively referred to as connective terminals 255, together with the (optional) seed layers 220 and under-bump metallurgies 240. In some embodiments, a singulation step is performed to separate the individual semiconductor packages P10, for example, by cutting through the stacked buffer layer 200, insulator layer 120, device layer 130, interconnection structure 140, encapsulant 180, and auxiliary carrier 190. Cutting lines may be arranged between individual package units PU. In some embodiments, the singulation process typically involves performing a wafer dicing process with a rotating blade and/or a laser beam. Following singulation, individual semiconductor packages P10 may be obtained.

Figure 2A:
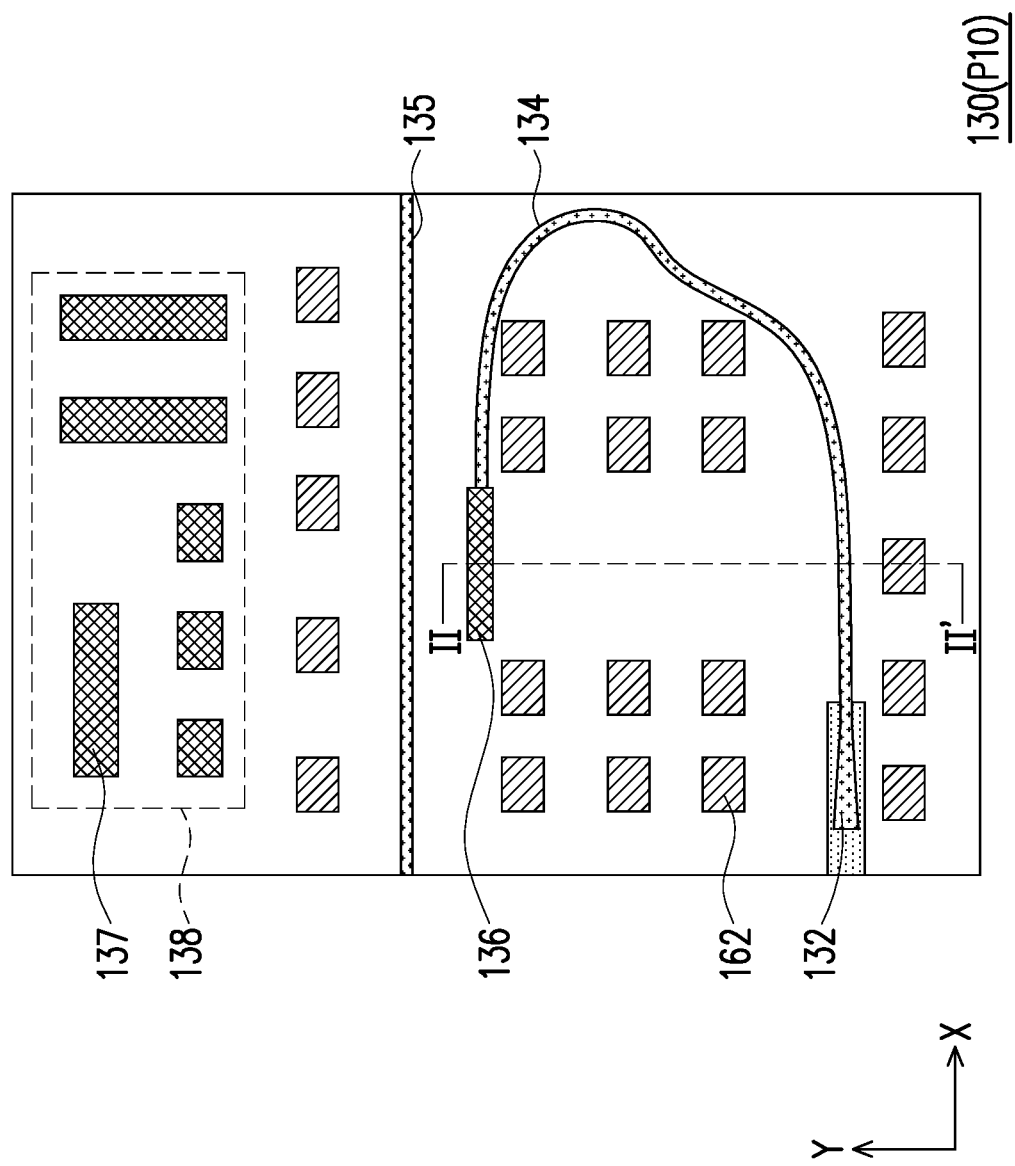
FIG. 2A is a schematic cross-sectional view of a device layer of a semiconductor package in accordance with some embodiments of the disclosure.
Figure 2B:
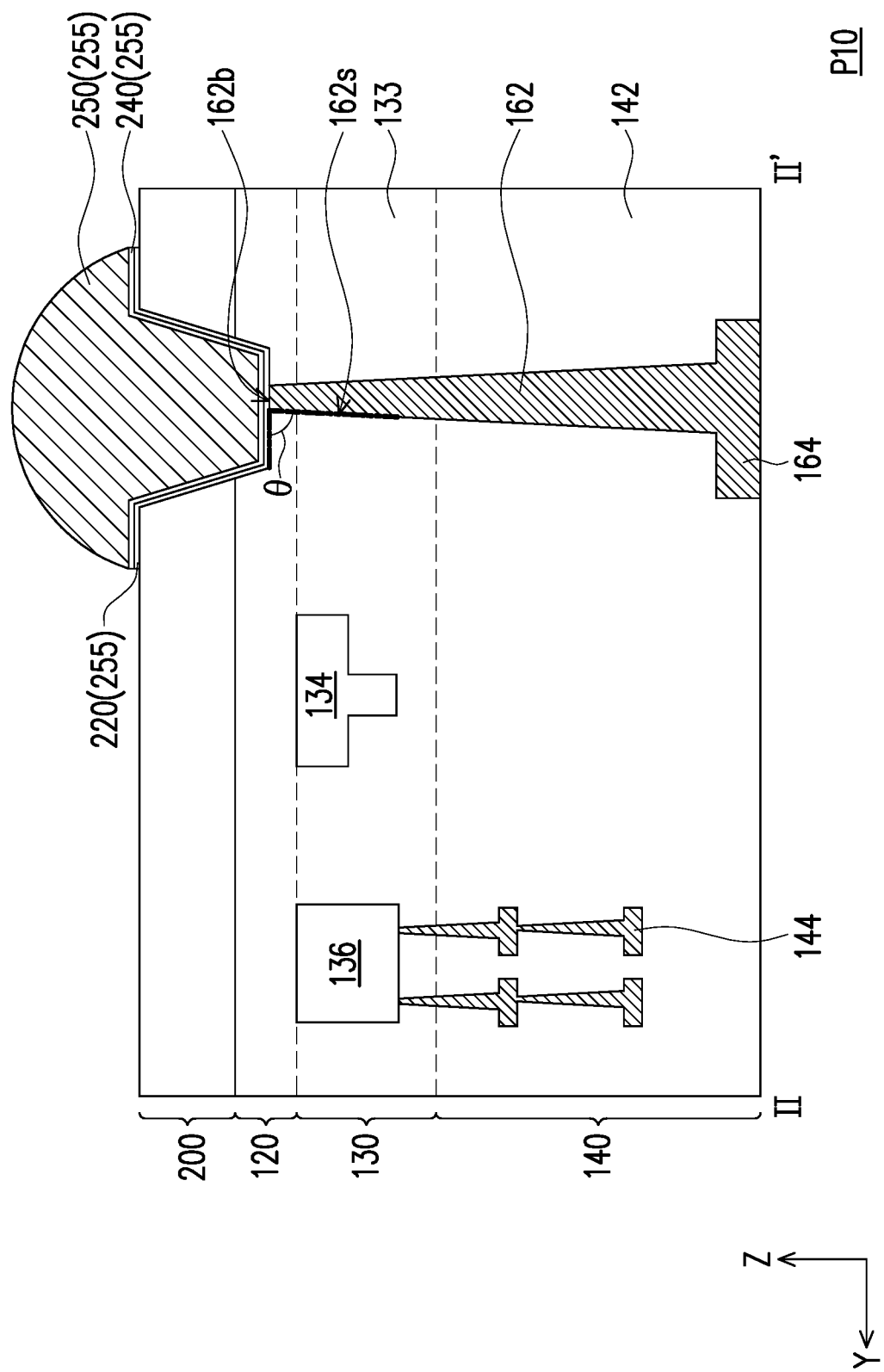
FIG. 2B is a schematic cross-sectional view of a portion of a semiconductor package in accordance with some embodiments of the disclosure.

FIG. 1M is a schematic cross-sectional view of a semiconductor package P10 according to some embodiments of the disclosure. The cross-sectional view of FIG. 1M may be considered to be taken in an XZ plane defined by the thickness direction Z and an X direction orthogonal to the Z direction. FIG. 2A is a schematic cross-sectional view of the semiconductor package P10 taken in an XY plane defined by the X direction and the orthogonal Y direction, where the three directions X, Y, and Z define a set of orthogonal Cartesian coordinates. The cross-sectional view of FIG. 2A is taken at the level height of the line I-I along the Z direction, passing through the device layer 130. FIG. 2B is a schematic cross-sectional view of a portion of the semiconductor package P10, taken in the YZ plane. The portion illustrated in FIG. 2B corresponds to the line II-II' illustrated in FIG. 2A.

Referring to FIG. 1M, FIG. 2A, and FIG. 2B, according to some embodiments, the semiconductor package P10 includes the semiconductor die 170 which is electrically connected to the connective terminals 255 by the bonding vias 162. The bonding vias 162 extend through the interconnection structure 140, the device layer 130, and the insulator layer 120. The connective terminals 255 may reach the insulator layer 120 extending through the buffer layer 200. The device layer 130 may include a mode coupler 132, one or more waveguides 134, 135, and one or more optical devices 136. The mode coupler 132 may be configured to receive electromagnetic radiation from optical sources with which the semiconductor package P10 may interface during usage. In some embodiments, the mode coupler 132 is adapted to convey the received electromagnetic radiation to a waveguide 134 to which the mode coupler 132 is connected. In some embodiments, the mode coupler 132 is an edge coupler.

The mode coupler 132 and the waveguides 134, 135 may include a core of a first material (e.g., a semiconductor material) sandwiched between two layers of a second material, where the refractive indexes of the first material and the second material are selected so as to allow internal transmission of desired modes of electromagnetic radiation. For example, the waveguide 134 may include a semiconductor core formed from the front semiconductor layer 130a (illustrated, e.g., in FIG. 1A). The core may be buried between the insulator layer 120 and the additional insulator material 133 which may be disposed to form the device layer 130 as described with reference to FIG. 1A and FIG. 1B. The shape of the core of the waveguide is not particularly limited, and may be selected according to the application requirements. In some embodiments, the additional insulator material 133 may be the same material included in the insulator layer 120. In some embodiments, the additional insulator material 133 may be the same material included in the dielectric layer 142. In some embodiments, an interface between the additional insulator material 133 and the insulator layer 120 and/or the dielectric layer 142 (both indicated in FIG. 2B as dotted lines) may not be particularly visible, or even invisible, depending on the materials used and the process conditions adopted. In some embodiments, the additional insulator material 133 may be an oxide (e.g., silicon oxide), but the disclosure is not limited thereto. In some alternative embodiments, polymeric materials may also be adopted as additional insulator material 133.

In some embodiments, the waveguide 134 is connected to one end to the mode coupler 132, and to the other end to the optical device 136. The optical device 136 may be configured to generate electric signals upon detection of the electromagnetic radiation received from the waveguide 134. The signal may then be transmitted through the interconnection structure 140 to the semiconductor die 170, where it may be processed before being transmitted to other devices (not shown), for example through the connective terminals 255. In some embodiments, the optical device 136 may include a modulator, an optical detector, an optical amplifier, an optical coupler, a filter, a detector, and so forth. In some embodiments, the optical device 136 may be formed from the front semiconductor layer 130a, for example through a series of patterning and ion implantation steps. For this reason, the optical device 136 may be located within the device layer 130 at a substantially same level height along the Z direction as the waveguide 134.

In some embodiments, additional devices 137 formed in the device layer 130 may be part of auxiliary circuitry 138 (e.g., receiver circuit, digital backend circuits, and so on) which may be provided in some regions of the semiconductor package P10. The patterned conductive traces 144 of the interconnection structure 140 may extend through the dielectric layer 142 and the additional insulator material 133 to establish electrical connection to the optical device(s) 136 and the additional devices 137.

As illustrated in FIG. 2B, the bonding vias 162 extend from the bonding pads 164 to the seed layer 220 in the insulator layer 120, through the interconnection structure 140, the device layer 130, and at least a portion of the insulator layer 120. In some embodiments, the bonding vias 162 have a tapered profile, with a total width increasing proceeding from the connective terminals 255 towards the bonding pads 164. The total width may be measured along a direction perpendicular to the Z direction, for example, the Y direction of FIG. 2B. That is, the tapering angle θ defined by the sidewalls 162s of a bonding via and the connective terminal 255 may be smaller than 90 degrees, for example, in the range from 85 degrees to 89 degrees.

In some embodiments, the auxiliary carrier 190 may be part of the finished semiconductor package P10. In some embodiments, the auxiliary carrier 190 may facilitate handling of the semiconductor package P10, and may be referred to as a handling substrate. In some embodiments, the thickness of the auxiliary carrier 190 may be adjusted, for example via a grinding and/or etching process, so as to reduce the total thickness of the semiconductor package P10. In some embodiments, when the auxiliary carrier 190 includes semiconductor materials or, more generally, materials having good thermal conductivity, the auxiliary carrier 190 may promote dissipation of the heat produced during use of the semiconductor package P10. In some embodiments, the auxiliary carrier 190 itself may act as a heat dissipation structure. In some alternative embodiments, an additional heat dissipation system (e.g., a heat sink or the like) may be added over the auxiliary carrier 190.

Figure 3:
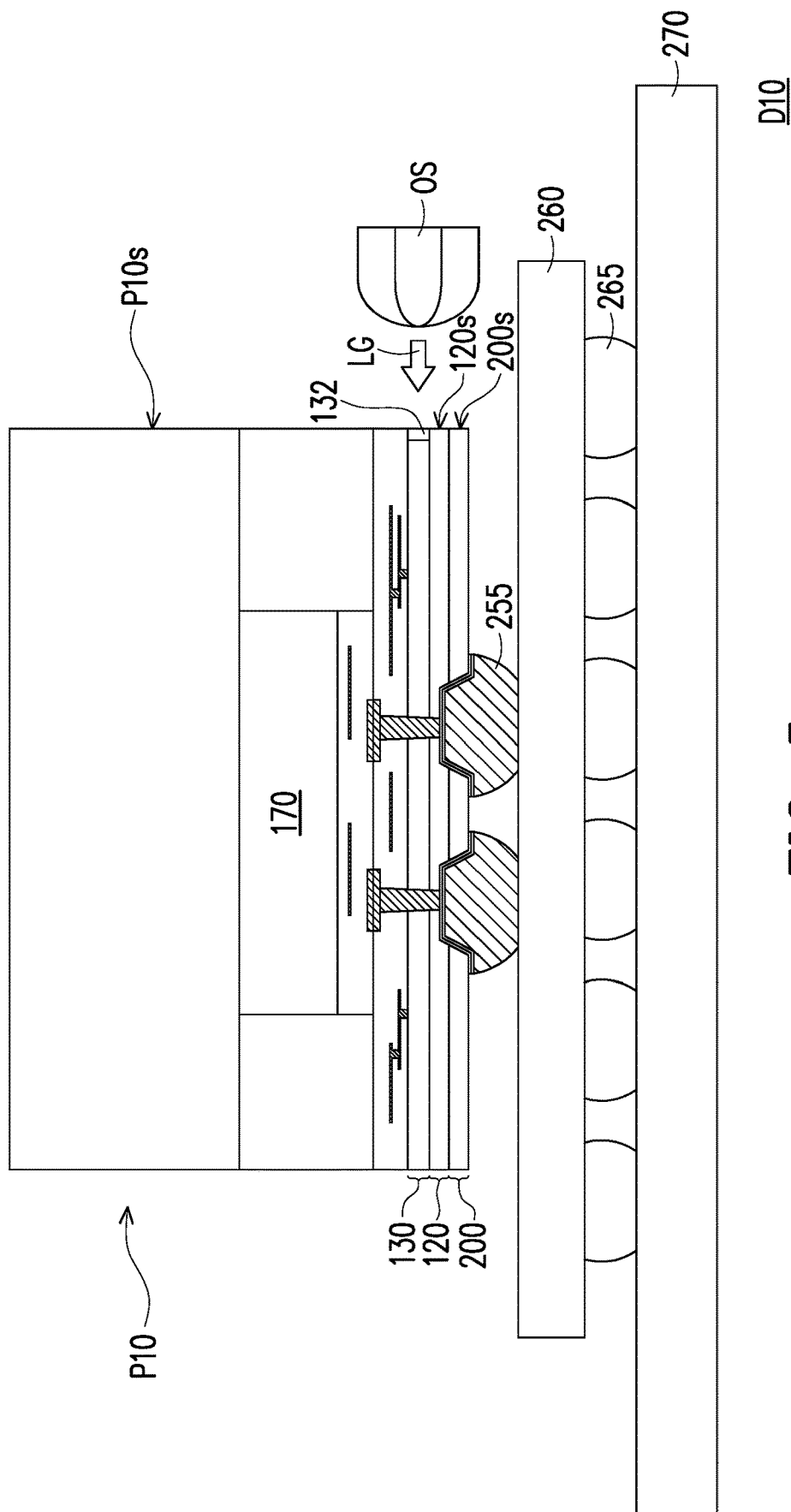
FIG. 3 is a schematic cross-sectional view illustrating a semiconductor device in accordance with some embodiments of the disclosure.

In some embodiments, the semiconductor package P10 may be integrated in larger devices through the connective terminals 255. For example, as illustrated in FIG. 3 for a semiconductor device D10 according to some embodiments, the semiconductor package P10 may be disposed on an interposer 260, to which it may be electrically connected by the connective terminals 255. In some embodiments, the connective terminals 255 may be C4 bumps. The interposer 260 may, in turn, be connected to a circuit carrier 270 (e.g., a mother board, a printed circuit board, or the like) by connectors 265. Referring to FIG. 2A and FIG. 3, in some embodiments, the semiconductor package P10 may be optically coupled to an optical source OS, for example, an optical fiber, a laser, another waveguide, and so on. In some embodiments, the optical source OS emits electromagnetic radiation LG towards the semiconductor package P10, and the mode coupler 132 receives the electromagnetic radiation LG and transmits the electromagnetic radiation LG to the optical devices 136 through the waveguide 134. In some embodiments, the optical source OS and the semiconductor package P10 are edge coupled. In some embodiments, the semiconductor package P10 includes the insulator layer 120 and the buffer layer 200 below the device layer 130. In some embodiments, the material of the buffer layer 200 has a refractive index at the emitting wavelength(s) of the optical source OS in the range from the refractive index of air to the refractive index of the material of the insulator layer 120. For example, in some embodiments, the electromagnetic radiation LG emitted by the optical source OS is centered at a wavelength within the range from 1.33 µm to 1.55 µm, and the insulator layer 120 may include a dielectric material such as silicon oxide. In such cases, the refractive index in the range from 1.33 µm to 1.55 µm (or at the emission wavelength of the optical source OS) of the material of the buffer layer 200 may be in the range between the refractive index of air and the refractive index of the material of the insulator layer 120 (e.g., silicon oxide) in the same wavelength range (or at the emission wavelength of the optical source OS).

In some embodiments, no silicon (e.g., silicon bulk or, possibly, any other semiconductor material) is stacked between the buffer layer 200 and the insulator layer 120. According to some embodiments, when the bulk semiconductor layer 110 of the initial substrate 100 (both illustrated, e.g., in FIG. 1A) is kept in the finished package, it may be necessary to form a lateral undercut within the bulk semiconductor layer 110 to reduce spurious transmission of the incident electromagnetic radiation LG through the semiconductor material of the bulk semiconductor layer 110 (sometimes referred to as "silicon noise"). In some embodiments, the material of the buffer layer 200 may be different from semiconductor materials. In some embodiments, the buffer layer 200 may not contain semiconductor materials. In such cases, it may be possible to reduce or prevent silicon noise in the semiconductor package P10 even without forming an undercut in the buffer layer 200. The side edge 200s of the buffer layer 200 may be substantially aligned (coplanar) with the side edge 120s of the insulator layer 120 even along the side P10s of the semiconductor package P10 facing the optical source OS. That is, with respect to a case in which the bulk semiconductor layer 110 of the initial substrate 100 (both illustrated, e.g., in FIG. 1A) is kept in the finished product, in the semiconductor package P10 it may be possible to reduce the "silicon noise" without having to form an undercut in the buffer layer 200. Therefore, manufacturing of the semiconductor package P10 may be simplified, increasing the product yield and reducing the production costs.

Figure 4:
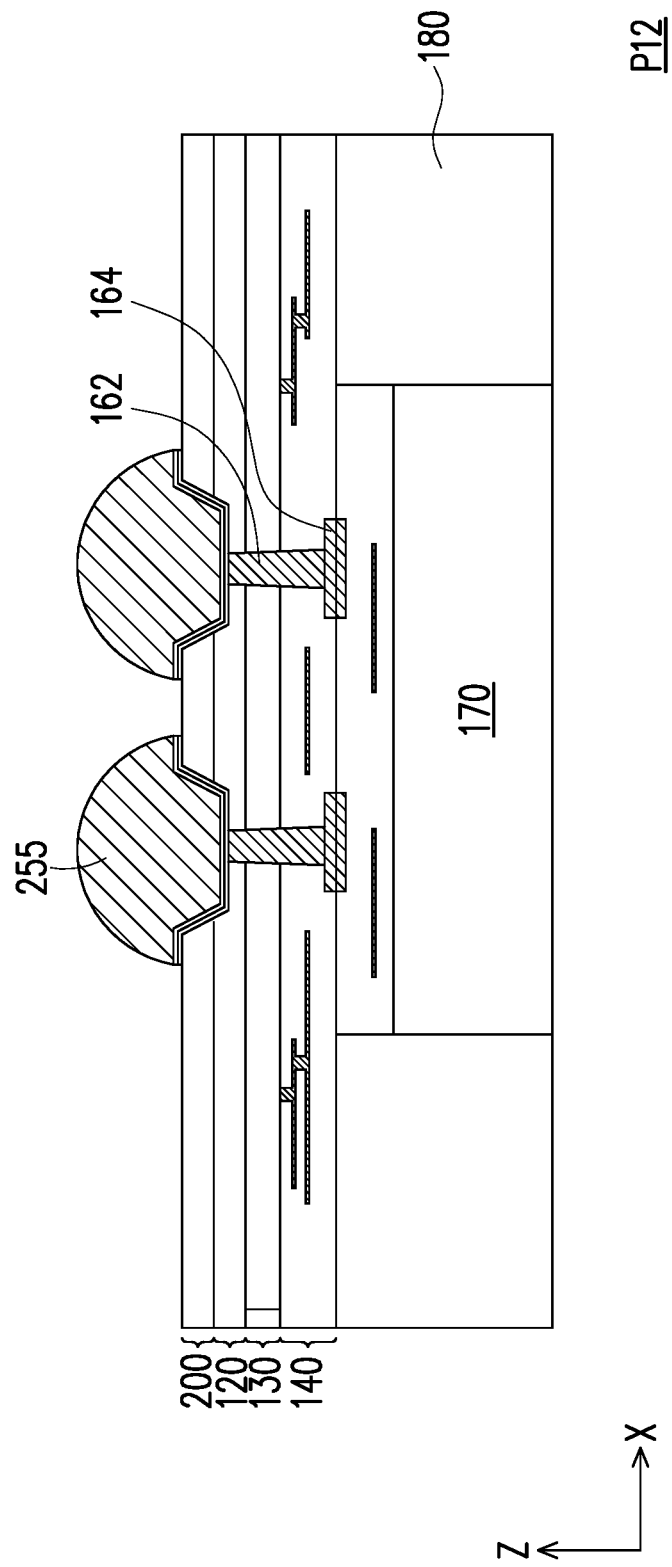
FIG. 4 is a schematic cross-sectional view of a semiconductor package in accordance with some embodiments of the disclosure.

FIG. 4 is a schematic cross-sectional view of a semiconductor package P12 according to some embodiments of the disclosure. In some embodiments, the semiconductor package P12 may have a similar structure as the semiconductor package P10, and may be fabricated following a similar manufacturing process as previously described with reference from FIG. 1A to FIG. 1M. In some embodiments, the semiconductor package P12 may have an identical structure to the semiconductor package P10, except for not including the auxiliary carrier 190 (illustrated, e.g., in FIG. 1M). That is, following singulation of the semiconductor packages P10, the auxiliary carrier 190 may be removed, for example via grinding, etching, or de-bonding. In some embodiments, following removal of the auxiliary carrier 190, the encapsulant 180 and, possibly, the semiconductor die(s) 170 may be exposed at a rear surface of the semiconductor package P12. By doing so, the total thickness of the semiconductor package P12 may be reduced. In these embodiments, additional heat dissipation system (e.g., heat sinks, thermal relaxation layers, and so on, not shown) may be directly provided on the semiconductor die 170 and the encapsulant 180. In the rest of the disclosure, the semiconductor packages will be illustrated as including the auxiliary carriers, however the disclosure is not limited thereto. That is, the disclosure includes alternative embodiments with respect to the ones illustrated in which the auxiliary carriers are removed from the corresponding semiconductor packages.

Figure 5:
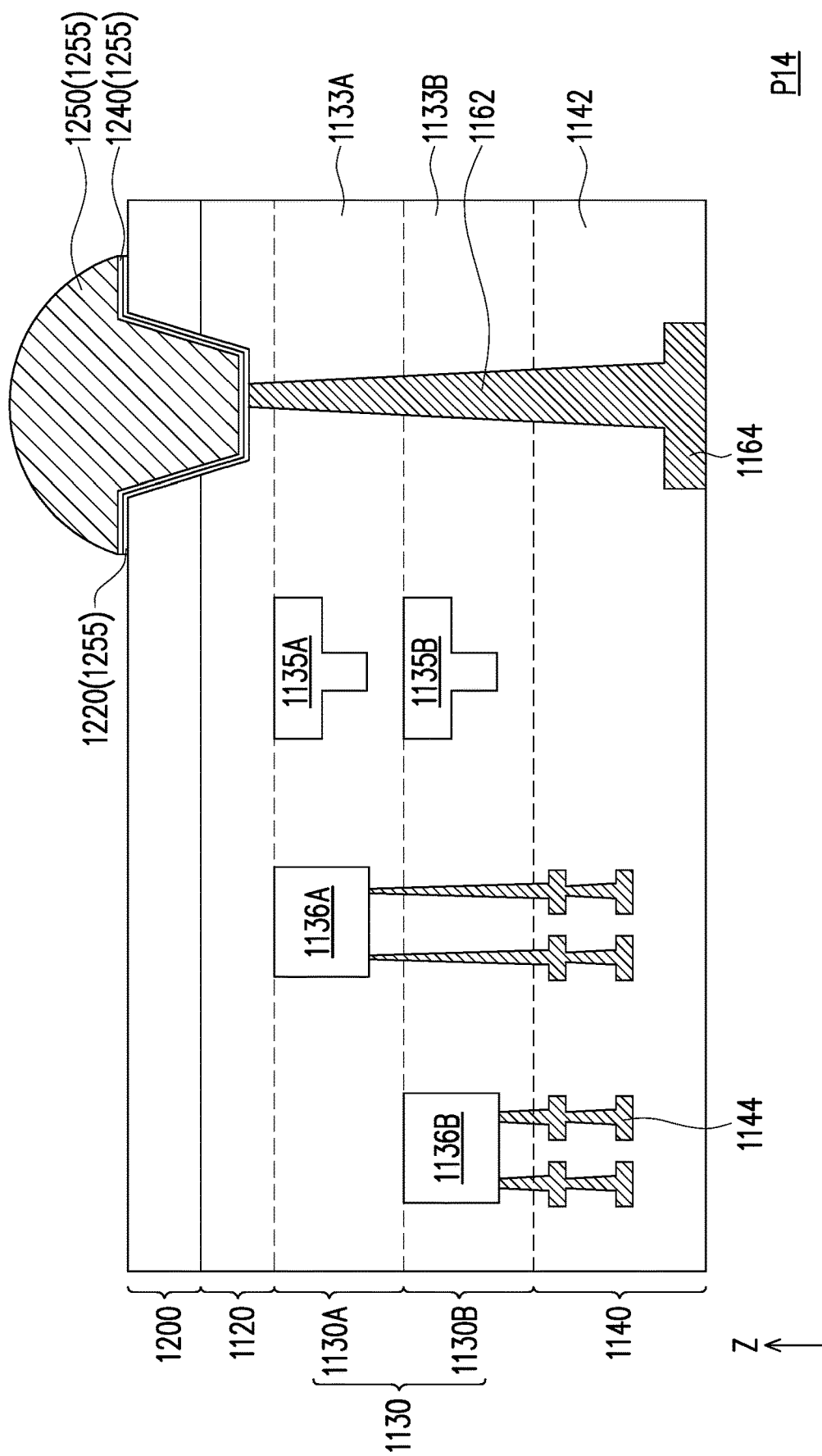
FIG. 5 is a schematic cross-sectional view of a portion of a semiconductor package in accordance with some embodiments of the disclosure.

FIG. 5 is a schematic cross-sectional view of a portion of a semiconductor package P14 according to some embodiments of the disclosure. The schematic cross-sectional view of FIG. 5 is taken in a YZ plane corresponding to the plane of view of FIG. 2B, in a corresponding region of the semiconductor package P14. In some embodiments, the semiconductor package P14 may have a similar structure as the semiconductor package P10, and may be fabricated following a similar manufacturing process as previously described with reference from FIG. 1A to FIG. 1M. Briefly, the semiconductor package P14 may include the buffer layer 1200, the insulator layer 1120, the device layer 1130, and the interconnection structure 1140 sequentially stacked. One or more encapsulated semiconductor devices (not shown) may be bonded (e.g., hybrid-bonded) to the bonding pads 1164 formed in the interconnection structure 1140, similar to what was previously discussed for to the semiconductor die 170 with reference to FIG. 1F.

In some embodiments, the device layer 1130 may include multiple tiers 1130A, 1130B. For example, the device layer 1130 may include the tier 1130A disposed directly on the insulator layer 1120, and the tier 1130B disposed on the tier 1130A in between the tier 1130A and the interconnection structure 1140. Each tier 1130A, 1130B may include corresponding waveguides 1135A, 1135B, optical devices 1136A, 1136B, and so on. The devices of the device layer 1130 may be vertically stacked, as the waveguides 1135A, 1135B, or may be horizontally distributed, as the optical devices 1136A, 1136B. The patterned conductive traces 1144 of the interconnection structure may extend through the dielectric layer(s) 1142 and one or both of the additional insulator materials 1133A, 1133B to establish electrical connection to the optical devices 1136A, 1136B or the additional devices (not shown) formed in each tier 1130A, 1130B. Similarly, the bonding vias 1162 may extend through both tiers 1130A, 1130B to reach the connective terminals 1255, for example contacting the seed layer 1220, the under-bump metallurgy 1240, or directly the bumps 1250.

In terms of manufacturing process, a device layer including multiple tiers such as the device layer 1130 may be fabricated sequentially. For example, the tier 1130A on top of the insulator layer 1120 may be fabricated following a similar process as previously described for the device layer 130 with reference to FIG. 1A and FIG. 1B. Thereafter, an additional front semiconductor layer (not shown) may be provided on the tier 1130A. The devices of the tier 1130B (e.g., the waveguides 1135B, the optical devices 1136B, etc.) may be fabricated from the additional front semiconductor layer, with similar processes followed for the devices of the tier 1130A. Thereafter, the additional insulator material 1133B may be provided. The manufacturing process may then proceed similarly to what was previously described with reference to FIG. 1C to FIG. 1M.

Figure 6A:
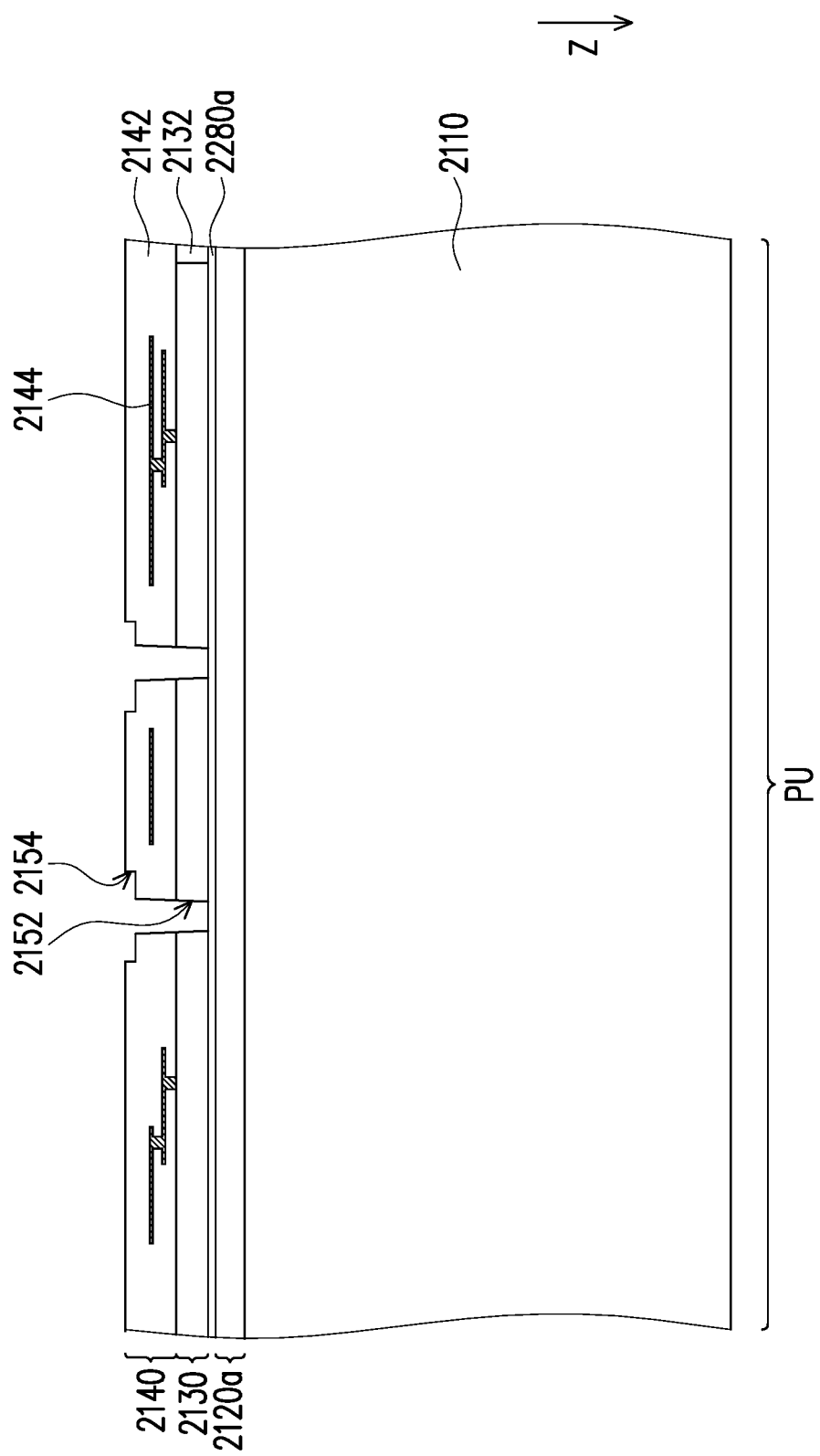
FIG. 6A to FIG. 6C are schematic cross-sectional views illustrating structures formed during a manufacturing process of a semiconductor package in accordance with some embodiments of the disclosure.
Figure 6B:
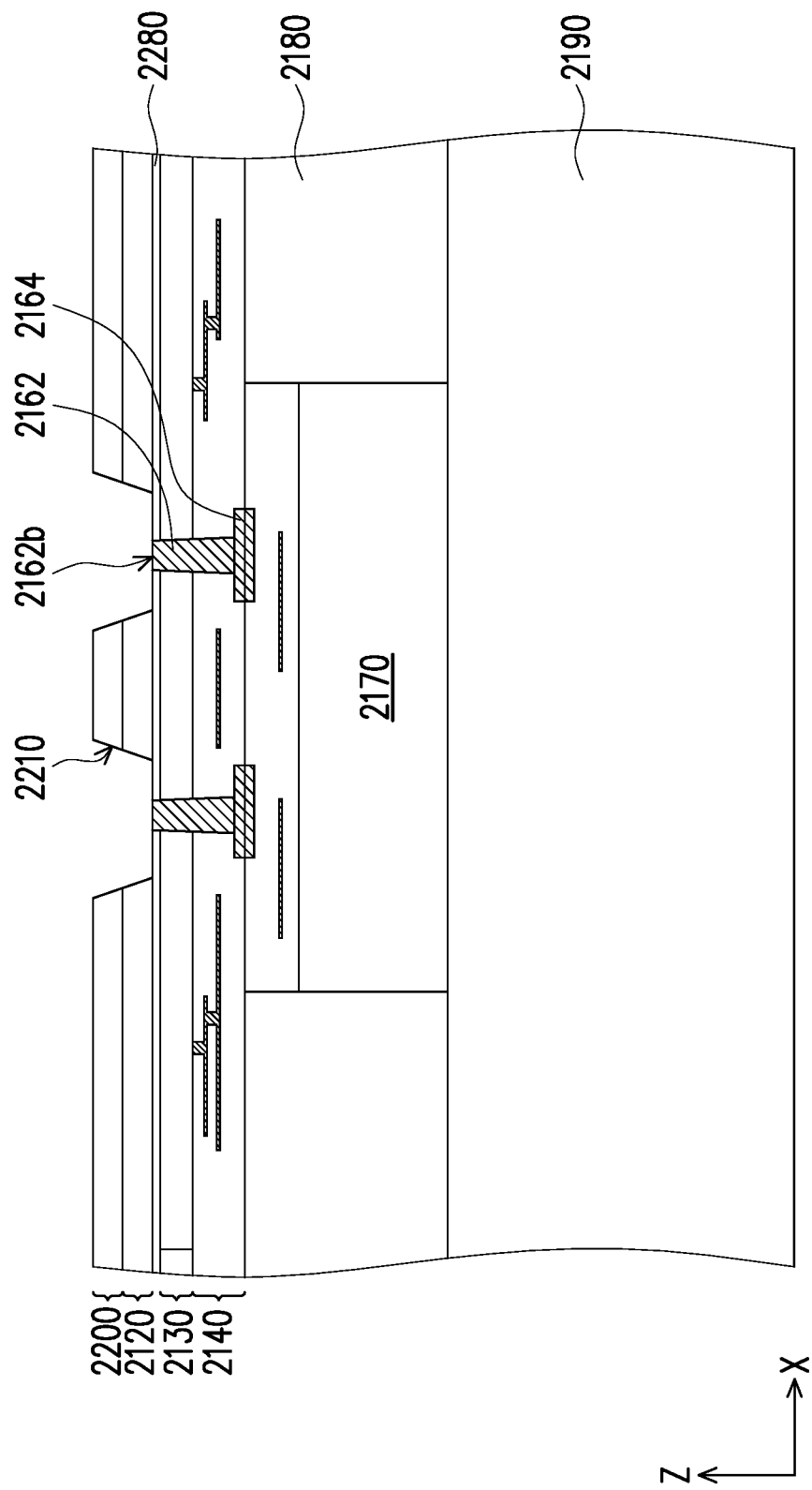
Figure 6C:
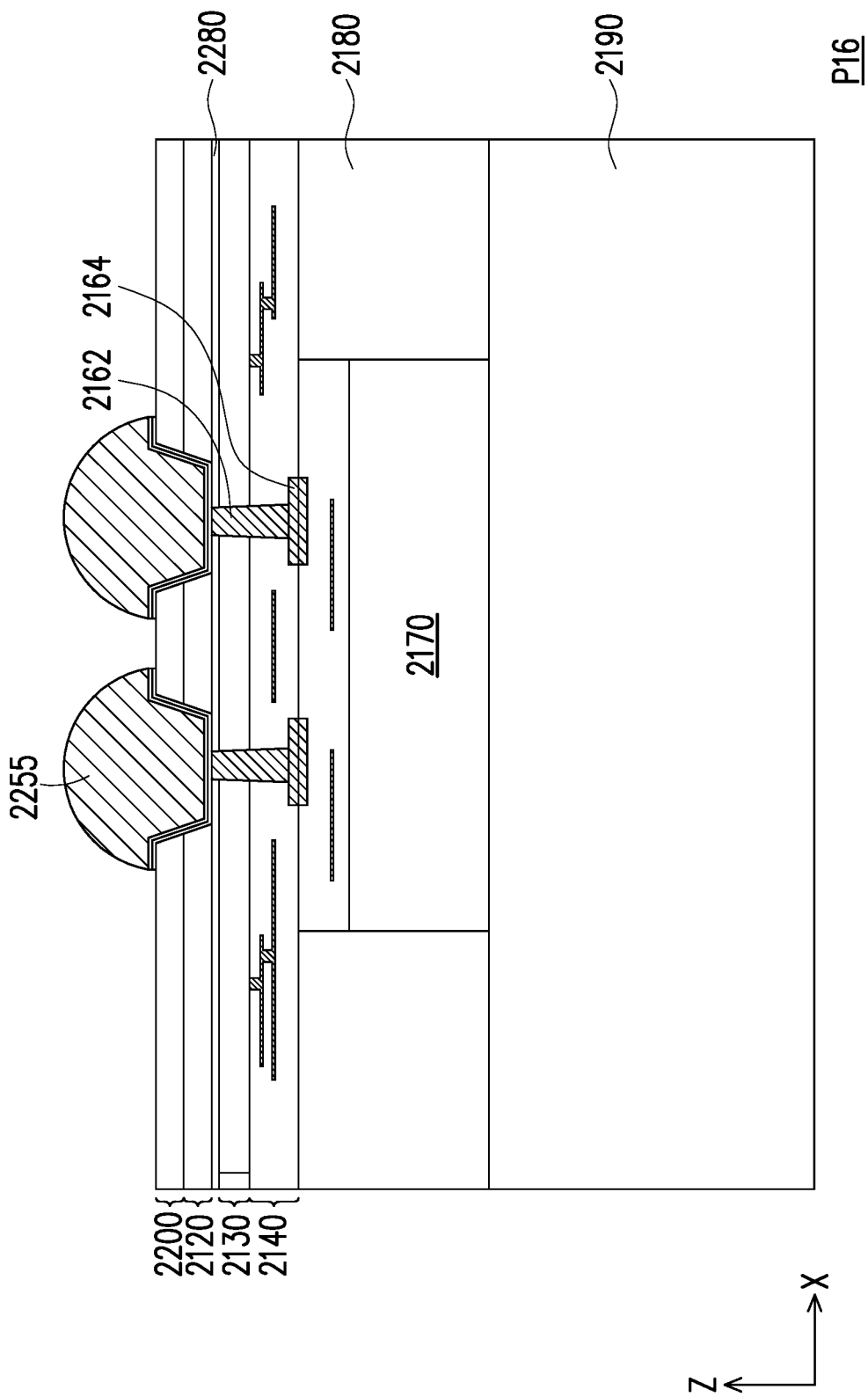

FIG. 6A to FIG. 6C are schematic cross-sectional views of structures produced during a manufacturing process of the semiconductor package P16 according to some embodiments of the disclosure. The structure illustrated in FIG. 6A may be similar to the structure illustrated in FIG. 1D, and may fabricated following similar processes as previously described. Briefly, the insulator layer 2120a, the device layer 2130, and the interconnection structure 2140 may be formed, in order, on the bulk semiconductor layer 2110. Via openings 2152 and trenches 2154 are formed in the interconnection structure 2140 and through the device layer 2130. In some embodiments, portions of the dielectric layer 2142 may be removed without affecting the patterned conductive traces 2144 of the interconnection structure 2140. In some embodiments, an etch stop layer 2280a is blanketly formed on the insulator layer 2120a before providing the front semiconductor layer from which the device layer 2130 is fabricated. In some embodiments, the etch stop layer 2280a includes a material which resists to the etching conditions applied to remove materials from the device layer 2130 and the interconnection structure 2140. For example, dielectric materials may be removed from the interconnection structure 2140 and the device layer 2130 during one or more etching steps to form the via openings 2152 and trenches 2154. In some embodiments, the via openings 2152 may initially stop at the etch stop layer 2280a. That is, the via openings 2152 may not penetrate into the insulator layer 2120a. In some embodiments, the dielectric materials removed in the etching steps may include oxides (e.g., silicon oxide), and the etch stop layer 2280a may include silicon nitride. In some embodiments, the insulator layer 2120a also includes oxides—for example, silicon oxide as the device layer 2130 or the dielectric layer 2142 of the interconnection structure 2140—and may be susceptible to be removed in the etching conditions adopted to form the via openings 2152. However, when the etch stop layer 2280a is formed on the insulator layer 2120a, the via openings may stop at the device layer 2130. In some embodiments, the thickness of the etch stop layer 2280a along the Z direction (e.g., the stacking direction of the insulator layer 2120a, the device layer 2130, and the interconnection structure 2140 on the bulk semiconductor layer 2110) may be in the range from 500 angstroms to 1000 angstroms. For example, the etch stop layer 2280a may be about 750 angstroms. In some embodiments, the etch stop layer 2280a is initially exposed at the bottom of the via openings 2152. However, the portions of etch stop layer 2280a exposed at the bottom of the via openings 2152 may be selectively removed, therefore exposing the insulator layer 2120a.

In some embodiments, process steps similar to the ones described above with reference to FIG. 1E to FIG. 1K may be performed on the structure of FIG. 6A to manufacture the structure of FIG. 6B. Briefly, after removal of the etch stop layer 2280a from the bottom of the via openings 2152, the via openings 2152 and trenches 2154 are filled with conductive material to form the bonding vias 2162 and the bonding pads 2164, to which the semiconductor die(s) 2170 is bonded (e.g., hybrid-bonded). Thereafter, the encapsulant 2180 and the auxiliary carrier 2190 are provided, the whole structure is overturned, and the bulk semiconductor layer 2110 may be removed. The buffer layer 2200 is then formed on the insulator layer 2120, including the contact openings 2210. As illustrated in FIG. 6B, at the bottom of the contact openings 2210 are exposed the ends 2162b of the bonding vias 2162 opposite to bonding pads 2164. In some embodiments, portions of the etch stop layer 2280 surrounding the bonding vias 2162 are also exposed at the bottom of the contact openings. In some embodiments, the contact openings 2210 extend through the buffer layer 2200 and the insulator layer 2120.

Figure 7B:
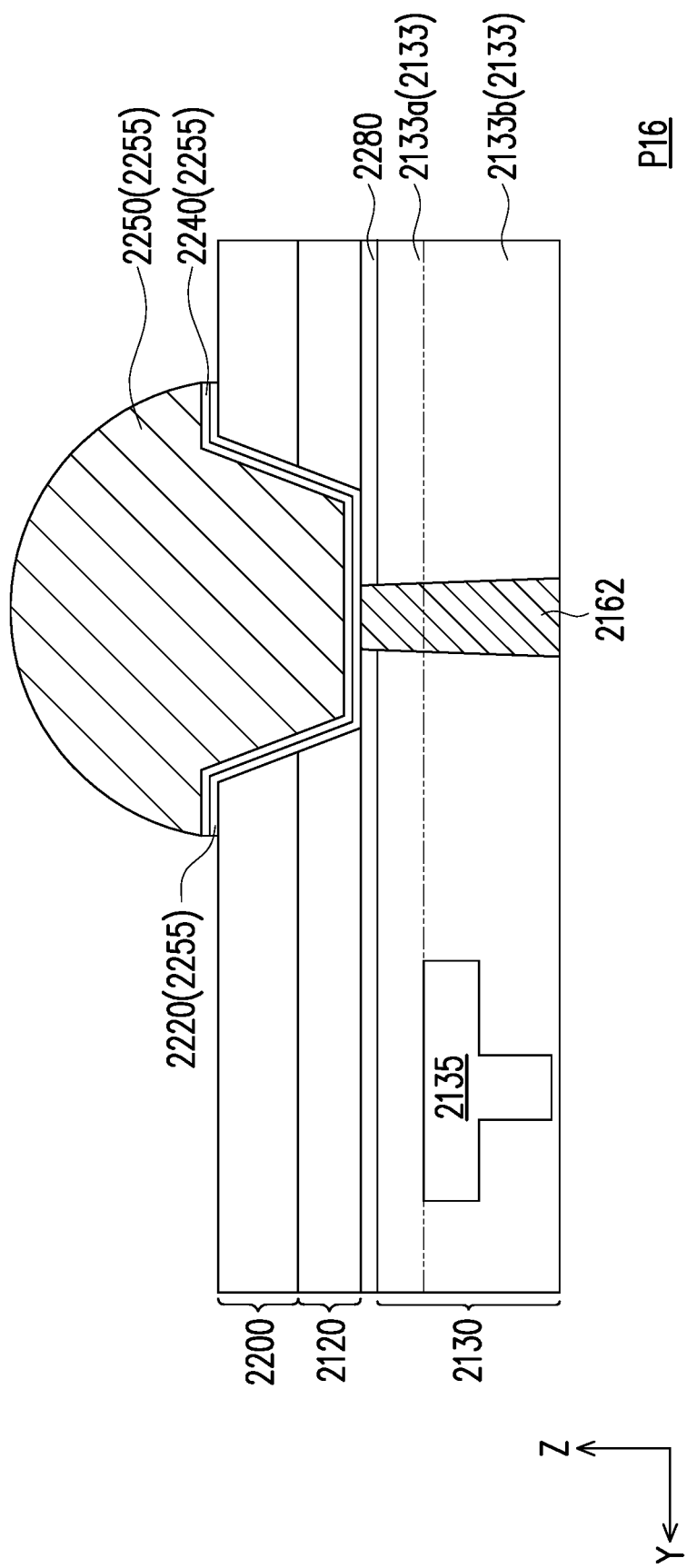

FIG. 6C is a schematic cross-sectional view of the semiconductor package P16 according to some embodiments of the disclosure. FIG. 7A is a schematic cross-sectional view of a portion of the semiconductor package P16 according to some embodiments of the disclosure. The schematic cross-sectional view of FIG. 7A is taken in a YZ plane corresponding to the plane of view of FIG. 2B, in a corresponding region of the semiconductor package P16. FIG. 7B is an enlarged view of the region of the semiconductor package P16 delimited by the area A in FIG. 7A. In some embodiments, the semiconductor package P16 may be obtained from the structure illustrated in FIG. 6B following similar steps as previously described with reference to FIG. 1K to FIG. 1M. Briefly, the connective terminals 2255 are formed in the contact openings 2210, and singulation of the packages is performed if necessary. In some embodiments, the connective terminals 2255 are formed extending through the buffer layer 2200 and the insulator layer 2120. In some embodiments, the connective terminals extend through the entire thickness (in the Z direction) of the insulator layer 2120.

In some embodiments, the etch stop layer 2280 remains in between the insulator layer 2120 and the device layer 2130. As illustrated in FIG. 7A and FIG. 7B, the connective terminals 2255 land on the bonding vias 2162, and may also extend on portions of the etch stop layer 2280 immediately adjacent to the bonding vias 2162. In some embodiments, the additional insulator material 2133 of the device layer 2130 includes a base layer 2133a and a cover layer 2133b stacked in this order on the insulator layer 2120. In some embodiments, the base layer 2133a may be provided on the blanket etch stop layer 2280a (illustrated, e.g., in FIG. 6A) before the front semiconductor layer from which the devices of the device layer 2130 are formed is provided. In some embodiments, the base layer 2133a and the cover layer 2133b may include materials with matching refractive indexes, or even the same material. In some embodiments, the material(s) of the base layer 2133a and the cover layer 2133b may be different from the material of the etch stop layer 2280. In some embodiments, the refractive index of the material of the etch stop layer 2280 may be not suitable or favorable for light conduction within the light-conductive patterns of the waveguides 2135. In some embodiments, the base layer 2133a may be provided to ensure that the light-conductive patterns of the waveguides 2135 are sandwiched between materials of suitable refractive indexes.

Figure 8:
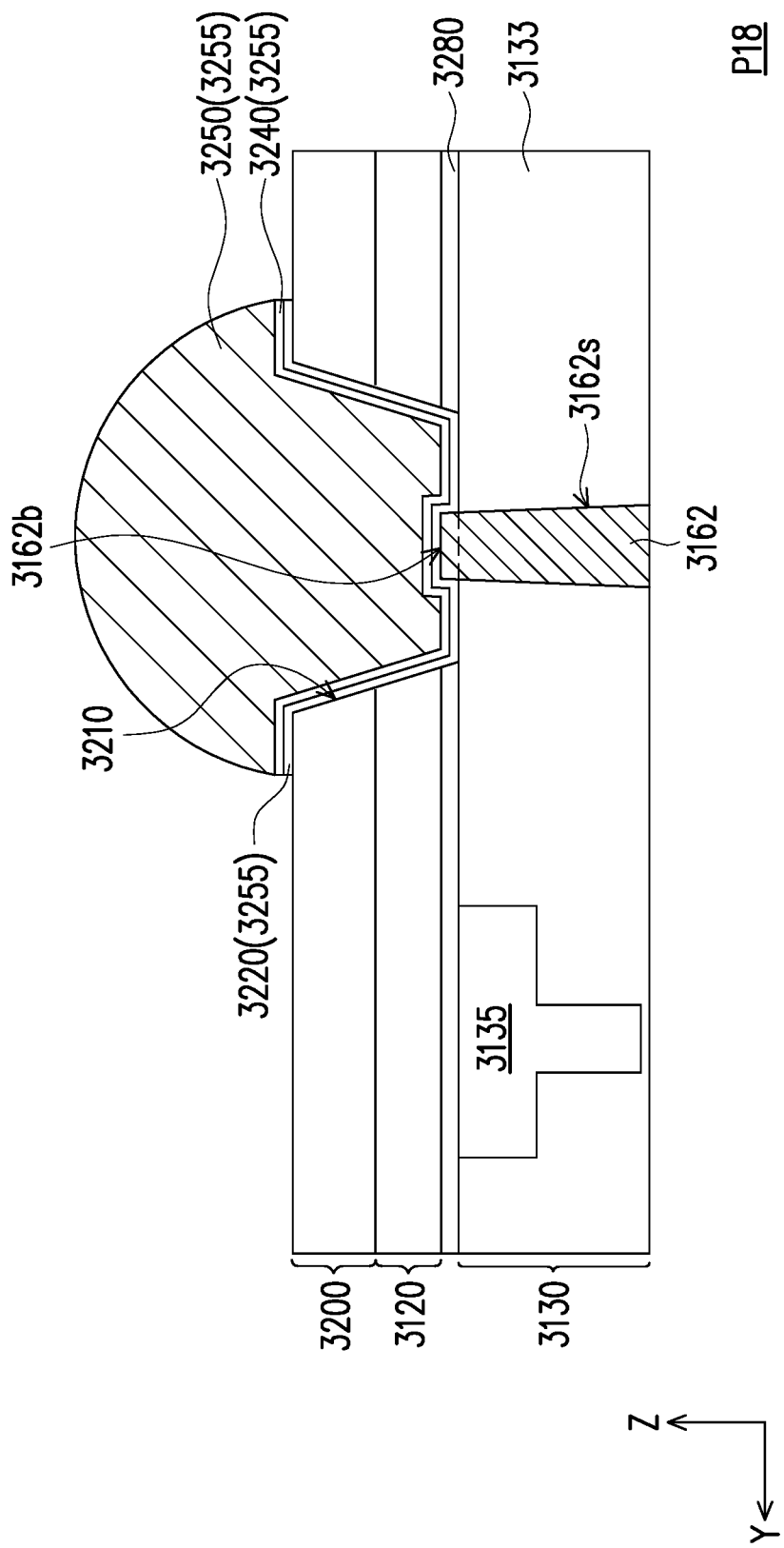
FIG. 8 is a schematic cross-sectional view of a portion of a semiconductor package in accordance with some embodiments of the disclosure.

FIG. 8 is a schematic cross-sectional view of a portion of a semiconductor package P18 according to some embodiments of the disclosure. The schematic cross-sectional view of FIG. 8 is taken in a YZ plane corresponding to the plane of view of FIG. 7B, in a corresponding region of the semiconductor package P18. The semiconductor package P18 may have a similar structure to the semiconductor package P16 of FIG. 6C, and may be manufactured following a similar process as previously described. For example, the etch stop layer 3280 is also provided in between the insulator layer 3120 and the device layer 3130. In some embodiments, during manufacturing of the semiconductor package P18, after the contact openings 3210 are formed in the buffer layer 3200 and the insulator layer 3120, in a step corresponding to the structure illustrated in FIG. 6B, the portions of etch stop layer 3280 exposed at the bottom of the contact openings 3210 are removed before forming the connective terminals 3255. Removal of the etch stop layer 3280 from the bottom of the contact openings 3210 may result in the connective terminals 3255 not only covering the end 3162b of the bonding via 3162, but even wrapping around the end 3162b. For example, at the bottom of the contact openings 3210, the seed layer 3220 (if included, otherwise the under-bump metallurgy 3240 or the bump 3250) may partially extend on the additional insulator material 3133 of the device layer 3130 and on the sidewall 3162s of the bonding via 3162, as well as on the end 3162*b* of the bonding via 3162. That is, the seed layer 3220 may present a raised plateau in correspondence of the end 3162*b*, surrounded by a trough in correspondence of the portions of seed layer 3162 extending on the additional insulator material 3133. The under-bump metallurgies 3240, being conformally formed on the seed layer 3220, may also present a similar shape.

In some embodiments, the waveguides 3135 (and the other devices of the device layer 3130) may be formed directly on the etch stop layer 3280. That is, during manufacturing of the semiconductor package P18, the front semiconductor layer from which the devices of the device layer 3130 are formed may be provided directly on the etch stop layer 3280, without first depositing a base layer as done for the semiconductor package P16. For example, the refractive indexes of the etch stop layer 3280 and the additional insulator material 3133 may be sufficiently compatible to allow propagation of the electro-magnetic radiation within the light-conducting patterns of the waveguides 3135. Therefore, formation of the base layer may be skipped. However, the disclosure is not limited thereto. In some alternative embodiments, the device layer 3130 may also include the base layer and the cover layer as previously described for the semiconductor package P16.

Figure 9A:
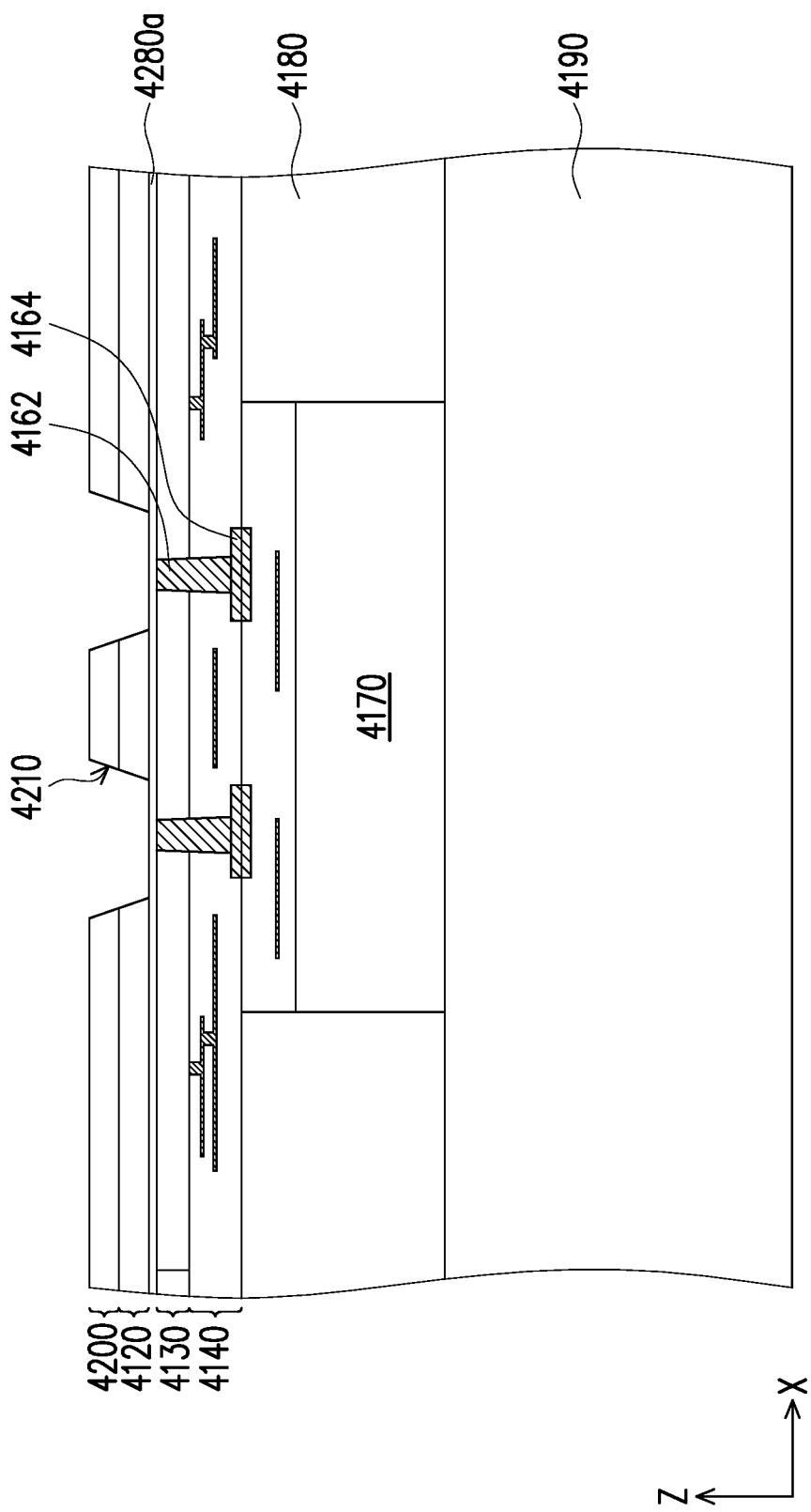
FIG. 9A and FIG. 9B are schematic cross-sectional views illustrating structures formed during a manufacturing process of a semiconductor package in accordance with some embodiments of the disclosure.
Figure 9B:
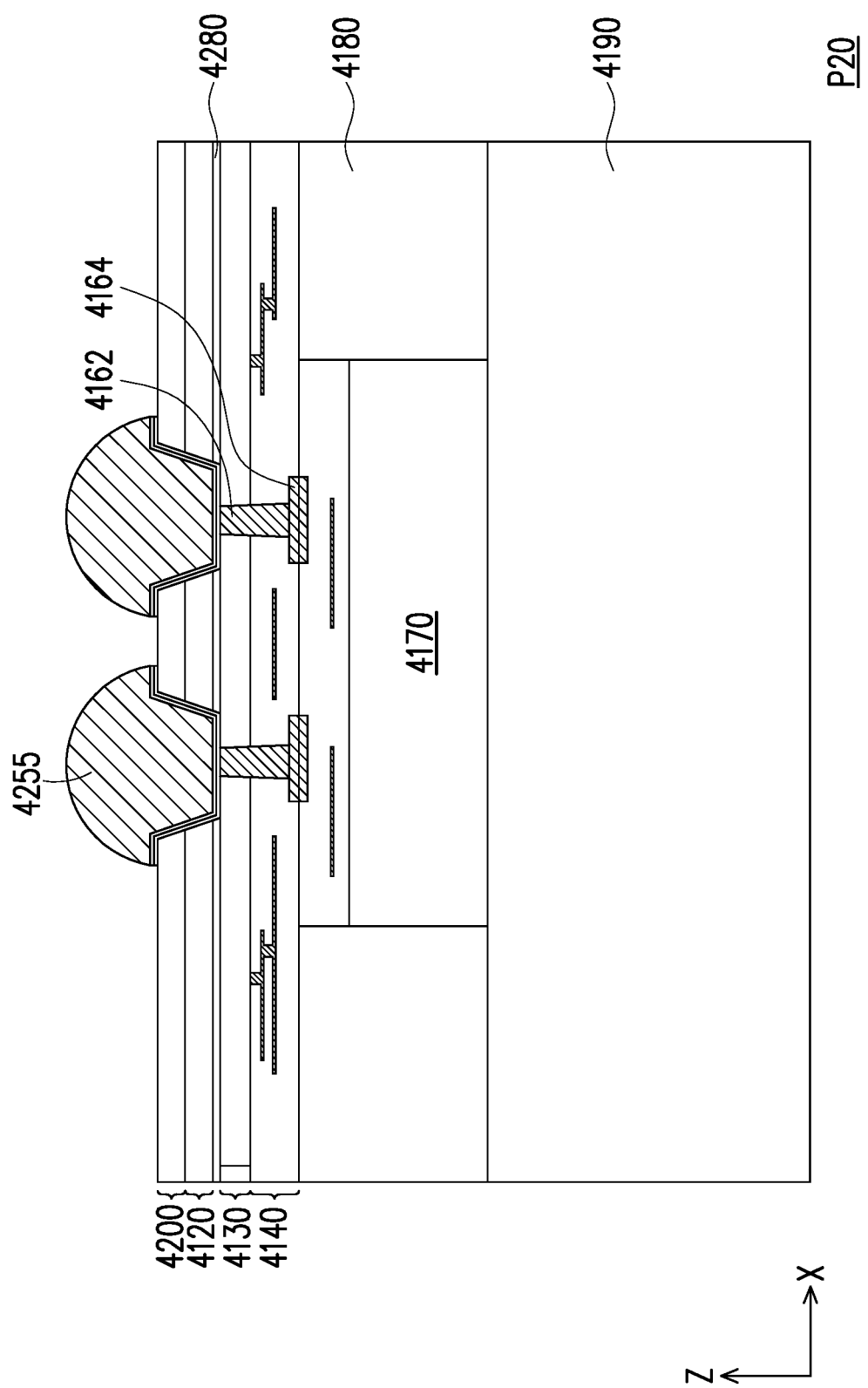

FIG. 9A is a schematic cross-sectional view of a structure formed during manufacturing of the semiconductor package SP20 (illustrated e.g., in FIG. 9B). The structure of FIG. 9A may be fabricated from the structure illustrated in FIG. 6A following similar steps as previously described with reference from FIG. 1E to FIG. 1K. In some embodiments, the etch stop layer 4280 may be left at the bottom of the via openings at the manufacturing stage illustrated in FIG. 6A, and may be used as etch stop when forming the contact openings 4210 in the buffer layer 4200 and the insulator layer 4120. Therefore, the bonding vias 4162 may be formed through the interconnection structure 4140 and the device layer 4130, but may not extend through the etch stop layer 4280 (differently than, for example, the semiconductor packages P16 of FIG. 7B or P18 of FIG. 8). Other aspects of the manufacturing process (e.g., bonding of the semiconductor die(s) 4170 to the bonding pads 4164, formation of the encapsulant 4180, provision of the auxiliary carrier 4190) may happen in a similar manner as previously described.

Figure 10:
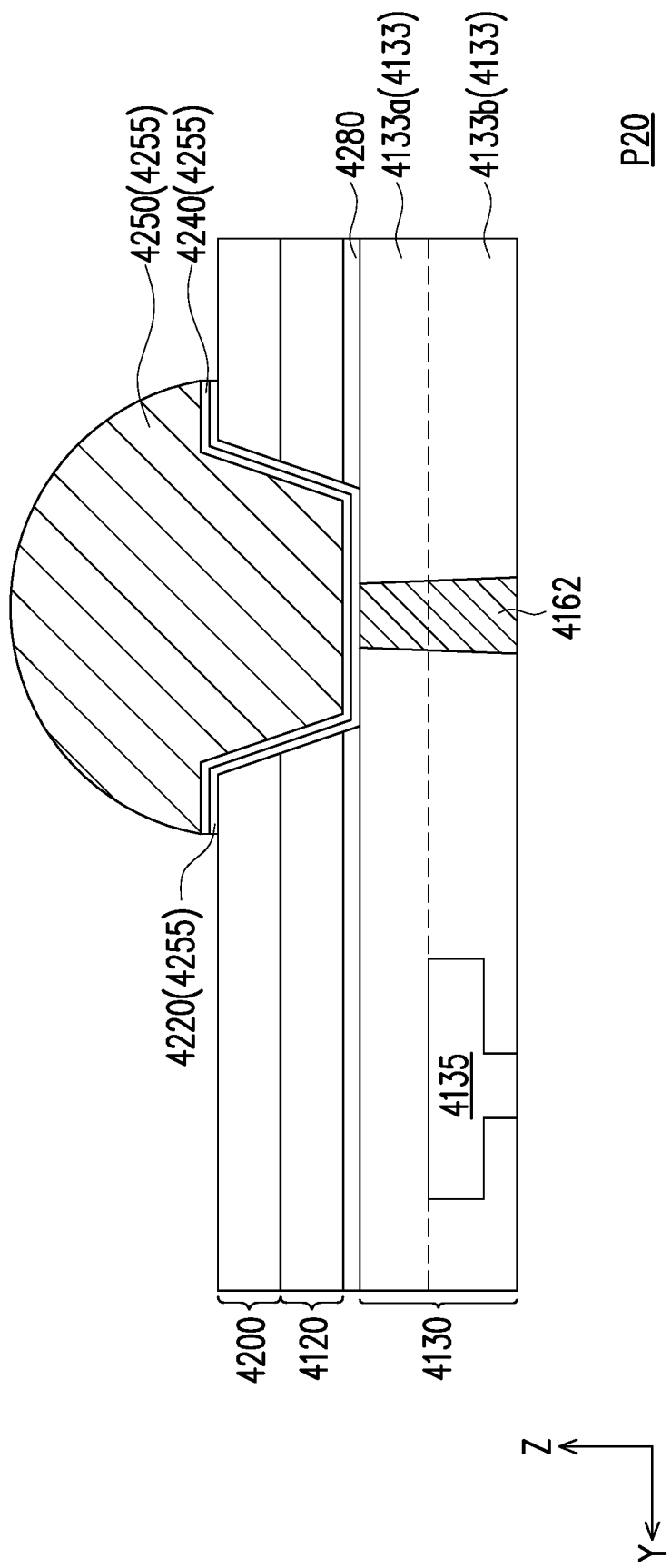
FIG. 10 is a schematic cross-sectional view of a portion of a semiconductor package in accordance with some embodiments of the disclosure.

FIG. 9B is a schematic cross-sectional view of the semiconductor package P20 according to some embodiments of the disclosure. FIG. 10 is a schematic cross-sectional view of a portion of the semiconductor package P20 according to some embodiments of the disclosure. The schematic cross-sectional view of FIG. 10 is taken in a YZ plane corresponding to the plane of view of FIG. 7B, in a corresponding region of the semiconductor package P20. In some embodiments, the semiconductor package P20 may be obtained from the structure illustrated in FIG. 9A following similar steps as previously described. Briefly, the etch stop layer 4280*a* is patterned to remove the portions exposed at the bottom of the contact openings 4210 so as to expose the bonding vias 4162. Thereafter, the connective terminals 4255 are formed in the contact openings 4210, and singulation of the packages is performed if necessary. In some embodiments, the connective terminals 4255 are formed extending through the buffer layer 4200. the insulator layer 4120, and the etch stop layer 4280. In some embodiments, the connective terminals extend through the entire thickness (in the Z direction) of the insulator layer 4120 and the etch stop layer 4280.

In some embodiments, the etch stop layer 4280 remains in between the insulator layer 4120 and the device layer 4130. As illustrated in FIG. 10, the connective terminals 4255 land on the bonding vias 4162, and may also extend on portions of the device layer 4130 immediately adjacent to the bonding vias 4162. In some embodiments, the bottom end of the connective terminals 4255 is surrounded by the etch stop layer 4280. That is, the seed layer 4220 (or, alternatively, the under-bump metallurgy 4240 or the bump 4250) may have a flat profile at the bottom of the connective terminals 4255, extending at a same level height along the Z direction as the etch stop layer 4280. In some embodiments, the device layer 4130 optionally includes the base layer 4133*a* and the cover layer 4133*b*, resulting in the devices (e.g., the waveguides 4135) being separated from the etch stop layer 4280.

Figure 11A:
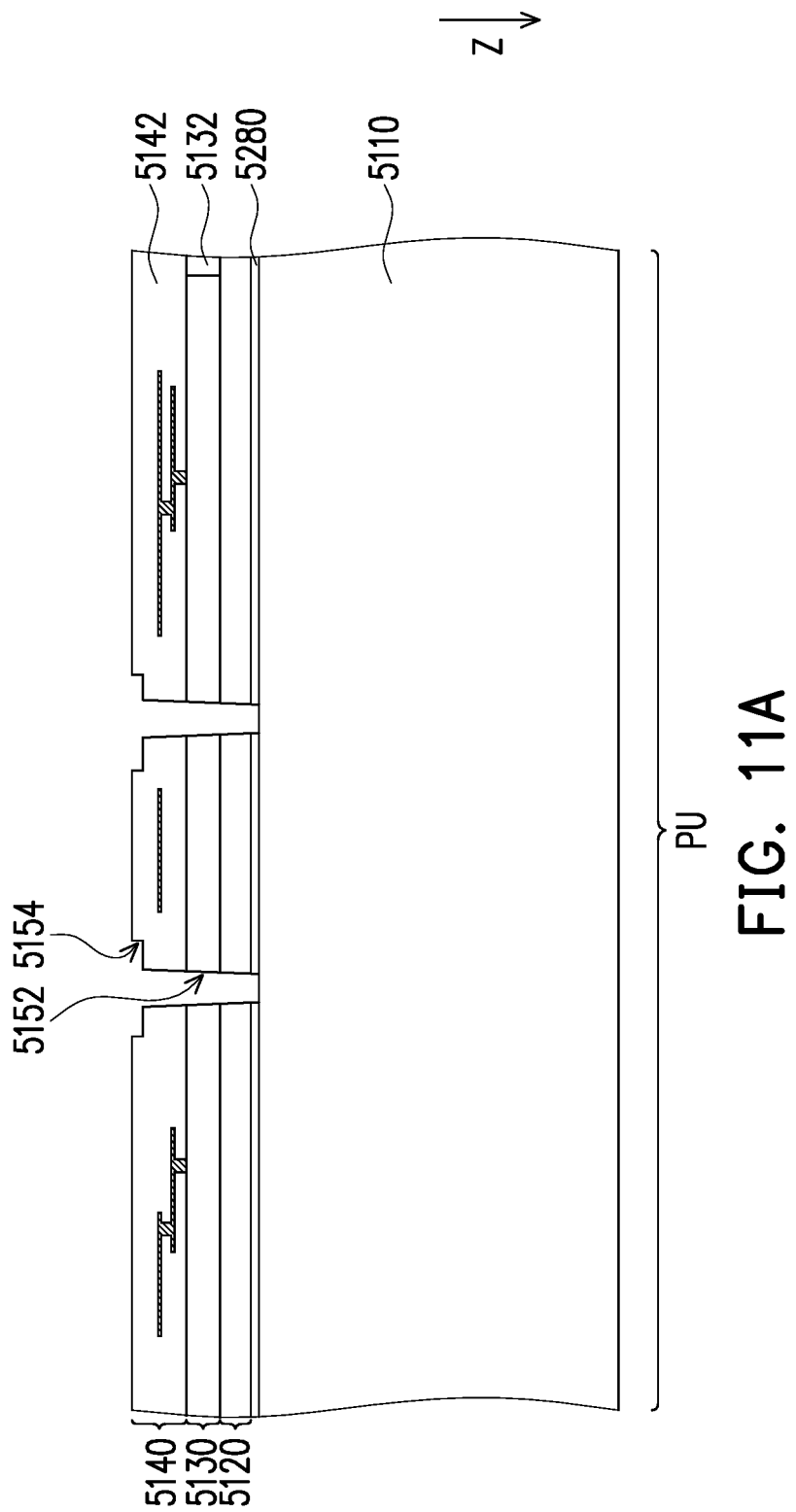
FIG. 11A and FIG. 11B are schematic cross-sectional views illustrating structures formed during a manufacturing process of a semiconductor package in accordance with some embodiments of the disclosure.

FIG. 11A is a schematic cross-sectional view of a structure produced during a manufacturing process of the semiconductor package P22 (illustrated, e.g., in FIG. 11B) according to some embodiments of the disclosure. The structure illustrated in FIG. 11A may be similar to the structure illustrated in FIG. 6A, and may fabricated following similar processes as previously described. Briefly, on the bulk semiconductor layer 5110 may be formed, in order, the insulator layer 5120, the device layer 5130, and the interconnection structure 5140. Via openings 5152 and trenches 5154 are formed in the dielectric layer 5142 of the interconnection structure 5140 and though the device layer 5130 and the insulator layer 5120. In some embodiments, the etch stop layer 5280 is blanketly formed on the bulk semiconductor layer 5110 before providing the insulator layer 5120. After formation of the via openings 5152, portions of etch stop layer 5180 may be exposed at the bottom of the via openings 5152. After removal of the exposed portions of etch stop layer 5180, the bulk semiconductor layer 5110 may be exposed at the bottom of the via openings 5152.

Figure 11B:
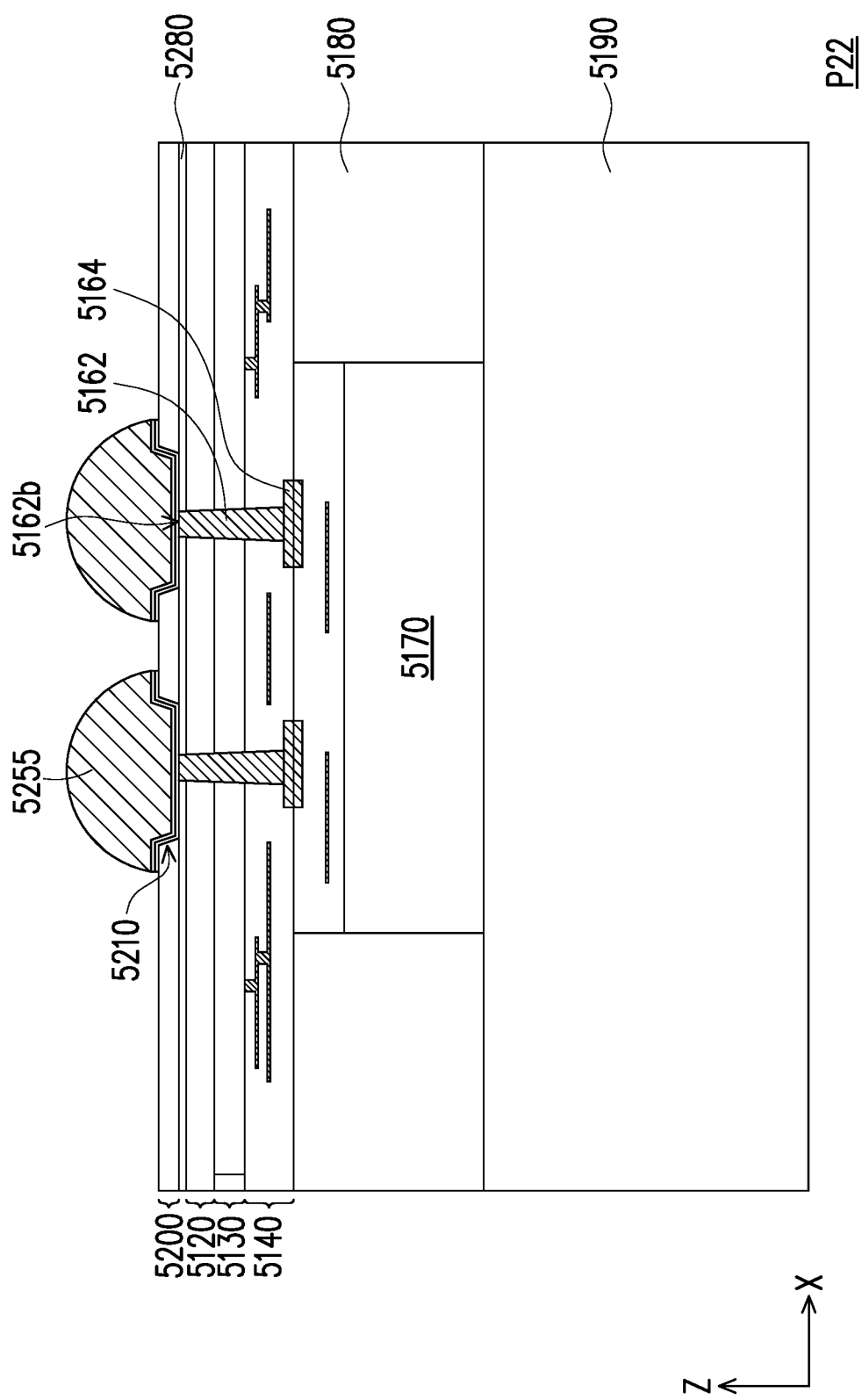

In some embodiments, process steps similar to the ones described above with reference to FIG. 1E to FIG. 1M may be performed on the structure of FIG. 11A to manufacture the semiconductor package P22 illustrated in FIG. 11B. Briefly, after removal of the etch stop layer 5280 from the bottom of the via openings 5152, the via openings 5152 and trenches 5154 are filled with conductive material to form the bonding vias 5162 and the bonding pads 5164, to which the semiconductor die(s) 5170 is bonded (e.g., hybrid bonded). Thereafter, the encapsulant 5180 and the auxiliary carrier 5190 are provided, the whole structure is overturned, and the bulk semiconductor layer 5110 is removed. The buffer layer 5200 is then formed on the insulator layer 2120, including the contact openings 5210. In some embodiments, the contact openings 5210 extend through the buffer layer 5200 stopping on the insulator layer 5120. Connective terminals 5255 may then be formed within the contact openings 5210 and singulation may be performed if needed.

Figure 12:
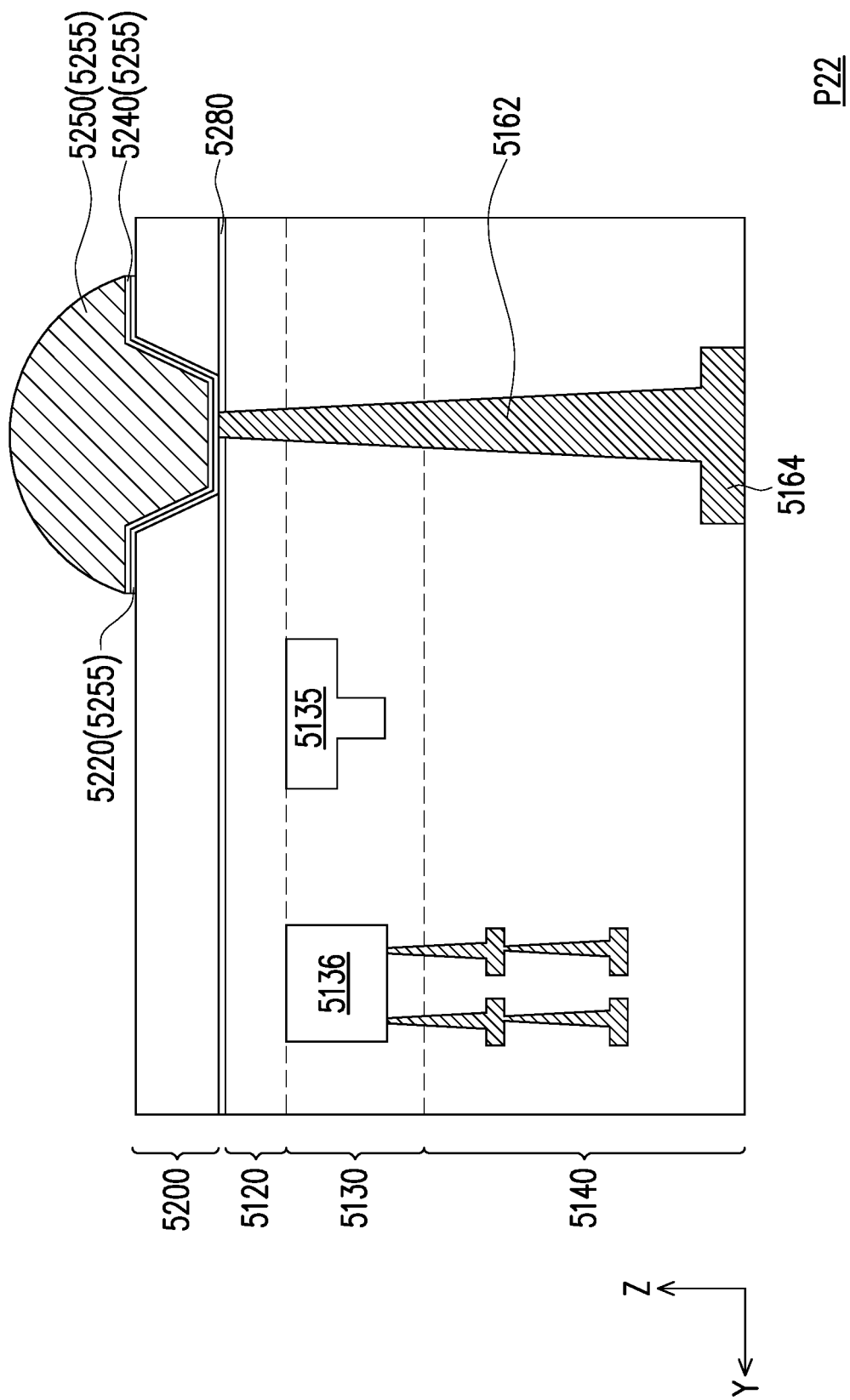
FIG. 12 is a schematic cross-sectional view of a portion of a semiconductor package in accordance with some embodiments of the disclosure.

FIG. 11B is a schematic cross-sectional view of the semiconductor package P22 according to some embodiments of the disclosure. FIG. 12 is a schematic cross-sectional view of a portion of the semiconductor package P22 according to some embodiments of the disclosure. The schematic cross-sectional view of FIG. 12 is taken in a YZ plane corresponding to the plane of view of FIG. 7B, in a corresponding region of the semiconductor package P22. As illustrated in FIG. 11B and FIG. 12, at the bottom of the contact openings 5210 are exposed the ends 5162*b* of the bonding vias 5162 opposite to bonding pads 5164. In some embodiments, portions of the etch stop layer 5280 surrounding the bonding vias 5162 are also exposed at the bottom of the contact openings. In some embodiments, the etch stop layer 5280 remains in between the insulator layer 5120 and the buffer layer 5200. As illustrated in FIG. 12, the connective terminals 5255 land on the bonding vias 5162, and may also extend on portions of the etch stop layer 5280 immediately adjacent to the bonding vias 5162. That is, the seed layer 5220 (or, alternatively, the under-bump metallurgy 5240 or the bump 5250) may at least partially extend on the etch stop layer 5280 on top of the insulator layer 5120. In some embodiments, even though the etch stop layer 5280 is disposed between the connective terminals 5225 and the insulator layer 5120, the connective terminals may still be considered as reaching the insulator layer 5120. As illustrated in FIG. 11B, the relative configurations of the connective terminals 5255, the bonding vias 5162, and the etch stop layer 5280 may be similar to the configuration described for the semiconductor package P16 with reference to FIG. 6C and FIG. 7B (on top of the insulator layer 5120 rather than the device layer 2130). However, the disclosure is not limited thereto. In some alternative embodiments, the connective terminals 5255, the bonding vias 5162, and the etch stop layer 5280 may be configured in a similar manner as previously described for the semiconductor packages P18 or P20 with reference to FIG. 8 and FIG. 10 (again, on top of the insulator layer 5120, rather than the device layers 3130 or 4130).

Figure 13A:
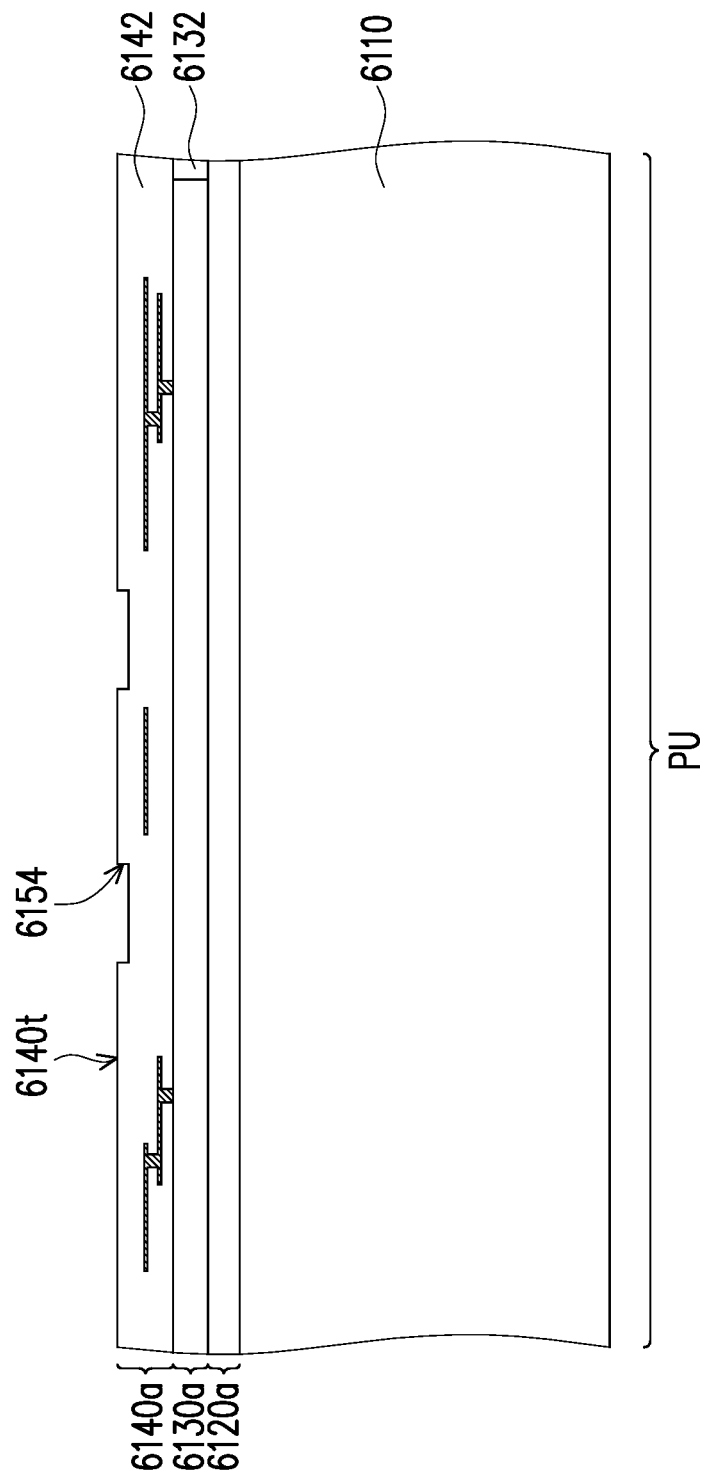
Figure 13B:
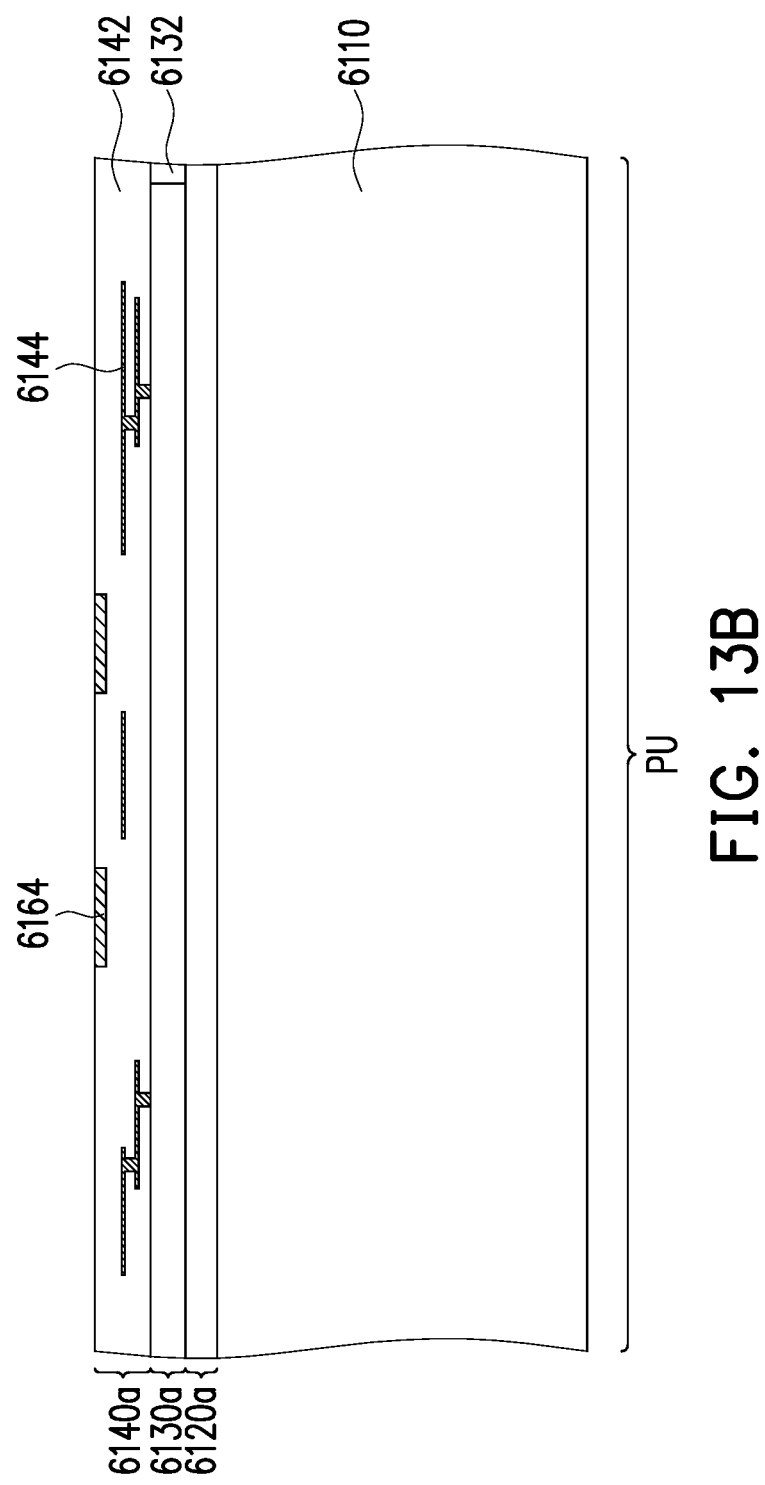
Figure 13C:
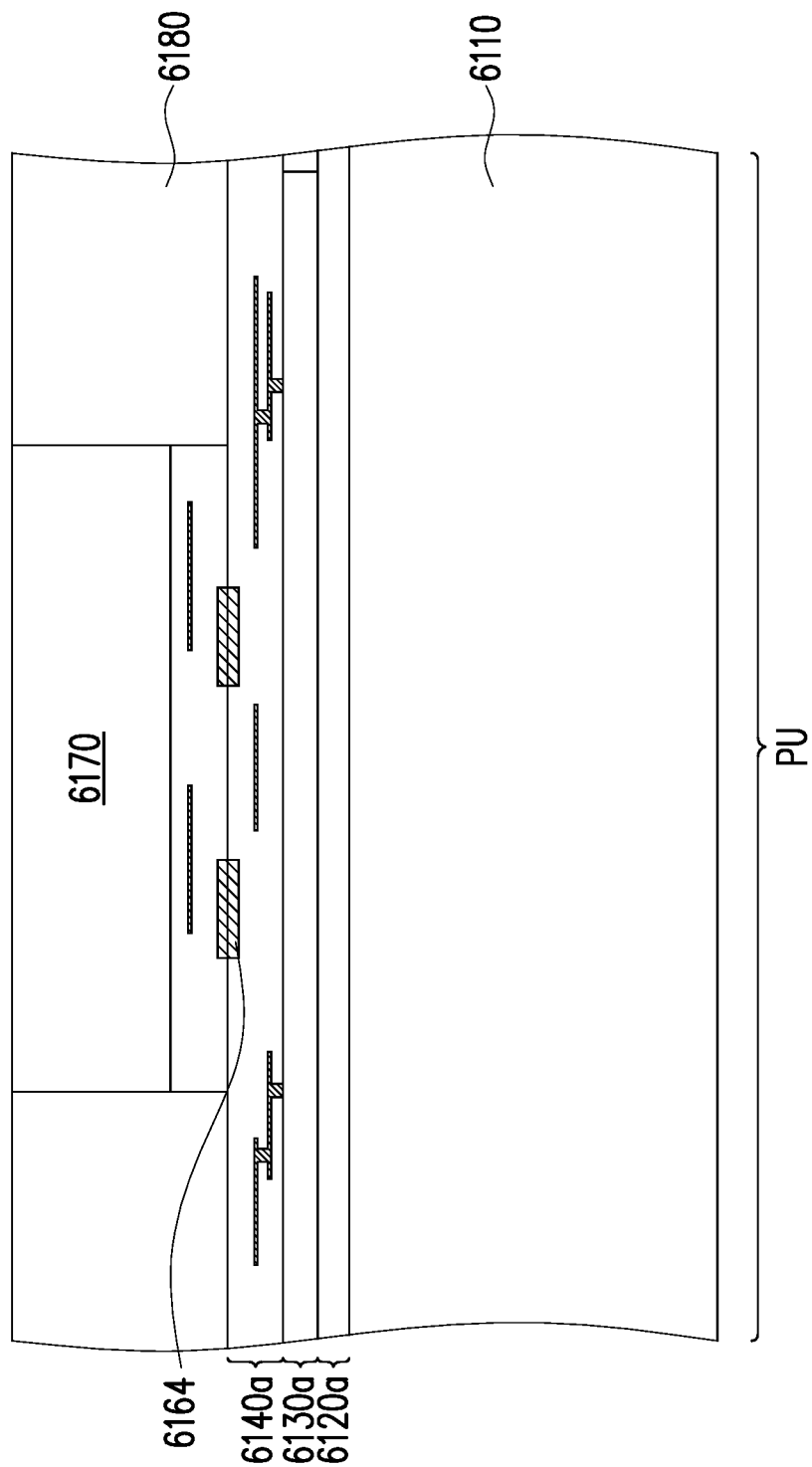

FIG. 13A to FIG. 13I are schematic cross-sectional views of structures produced during a manufacturing process of the semiconductor package P24 according to some embodiments of the disclosure. In some embodiments, the structure illustrated in FIG. 13A may be formed following similar process steps as previously described with reference from FIG. 1A to FIG. 1D. Briefly, on the bulk semiconductor layer 6110 may be formed, in order, the insulator layer 6120a, the device layer 6130a, and the interconnection structure 6140a. In some embodiments, trenches 6154 are formed in the interconnection structure 6140a at the top surface 6140t of the interconnection structure 6140a. In some embodiments, the trenches 6154 may open on the dielectric layer 6142 of the interconnection structure 6140. In some embodiments, via openings (similar, e.g., to the via openings 152 of FIG. 1D), are not formed at the manufacturing stage of FIG. 13A. Referring to FIG. 13A and FIG. 13B, in some embodiments the trenches 6154 are filled with conductive material to form the bonding pads 6164. As illustrated in FIG. 13C, the semiconductor die(s) 6170 are bonded (e.g., hybrid-bonded) to the bonding pads 6164, and the encapsulant 6180 is then provided on the interconnection structure 6140a to surround the semiconductor die(s) 6170.

Figure 13D:
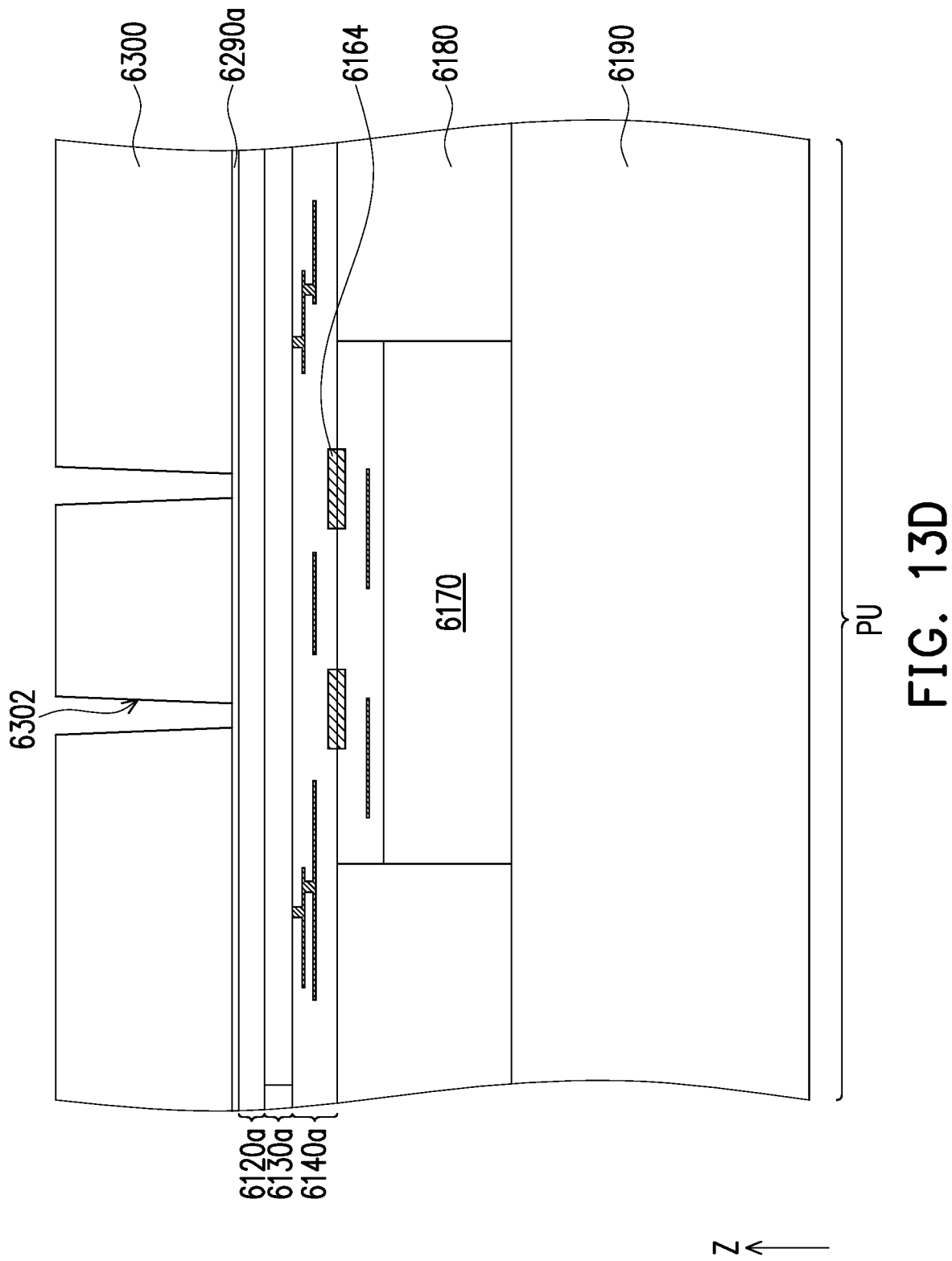

Referring to FIG. 13C and FIG. 13D, in some embodiments, the auxiliary carrier 6190 may be provided on the encapsulant 6180 and the semiconductor die(s) 6170, and the bulk semiconductor layer 6110 may be removed to expose the insulator layer 6120a, similar to what was previously described with reference to FIG. 1H and FIG. 1I. An etch stop layer 6290a and an auxiliary mask 6300 may then be formed on the insulator layer 6120a. In some embodiments, the etch stop layer 6290a may include similar material and be formed following similar processes as previously described for the etch stop layer 2280a with reference to FIG. 6A. For example, the etch stop layer 6290a may include an inorganic material, such as a nitride (e.g., silicon nitride), and be about 750 angstroms thick along the Z direction. The auxiliary mask 6300 included mask openings 6302 exposing portions of the etch stop layer 6290 overlying the bonding pads 6164. In some embodiments the auxiliary mask 6300 may include a positive or a negative photoresist, and may be formed through deposition, exposure, and development steps.

Figure 13E:
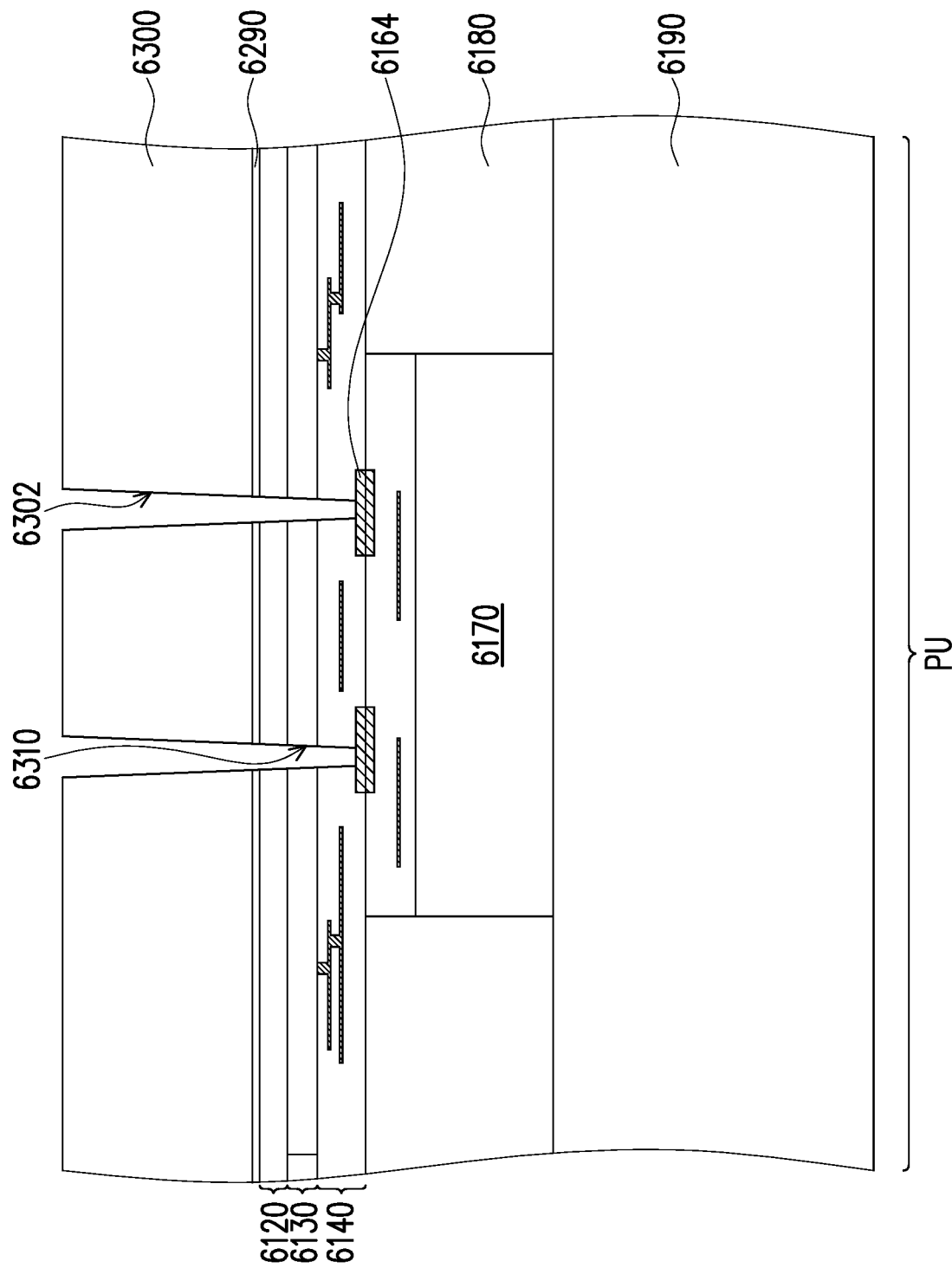
Figure 13F:
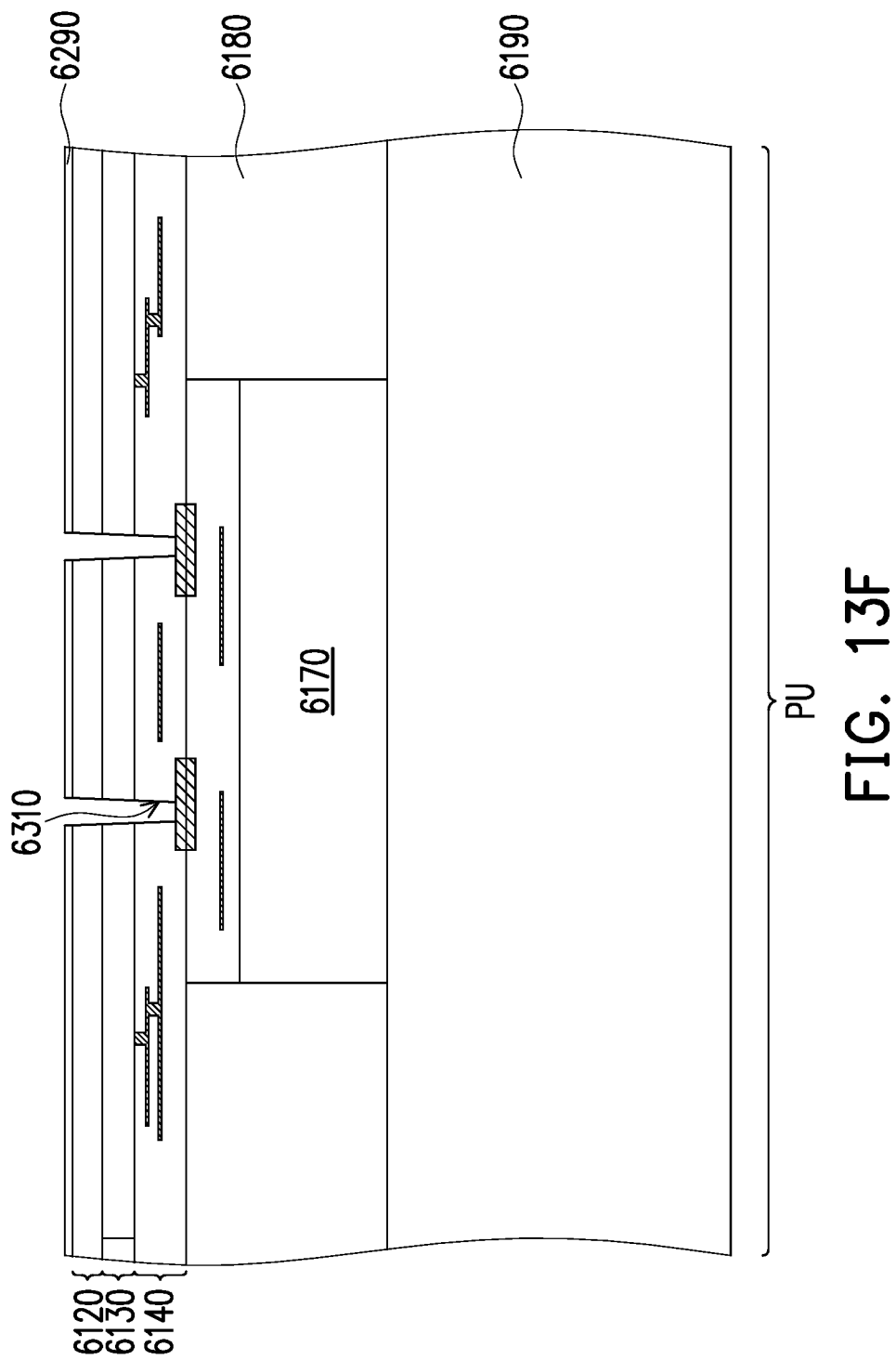
Figure 13G:
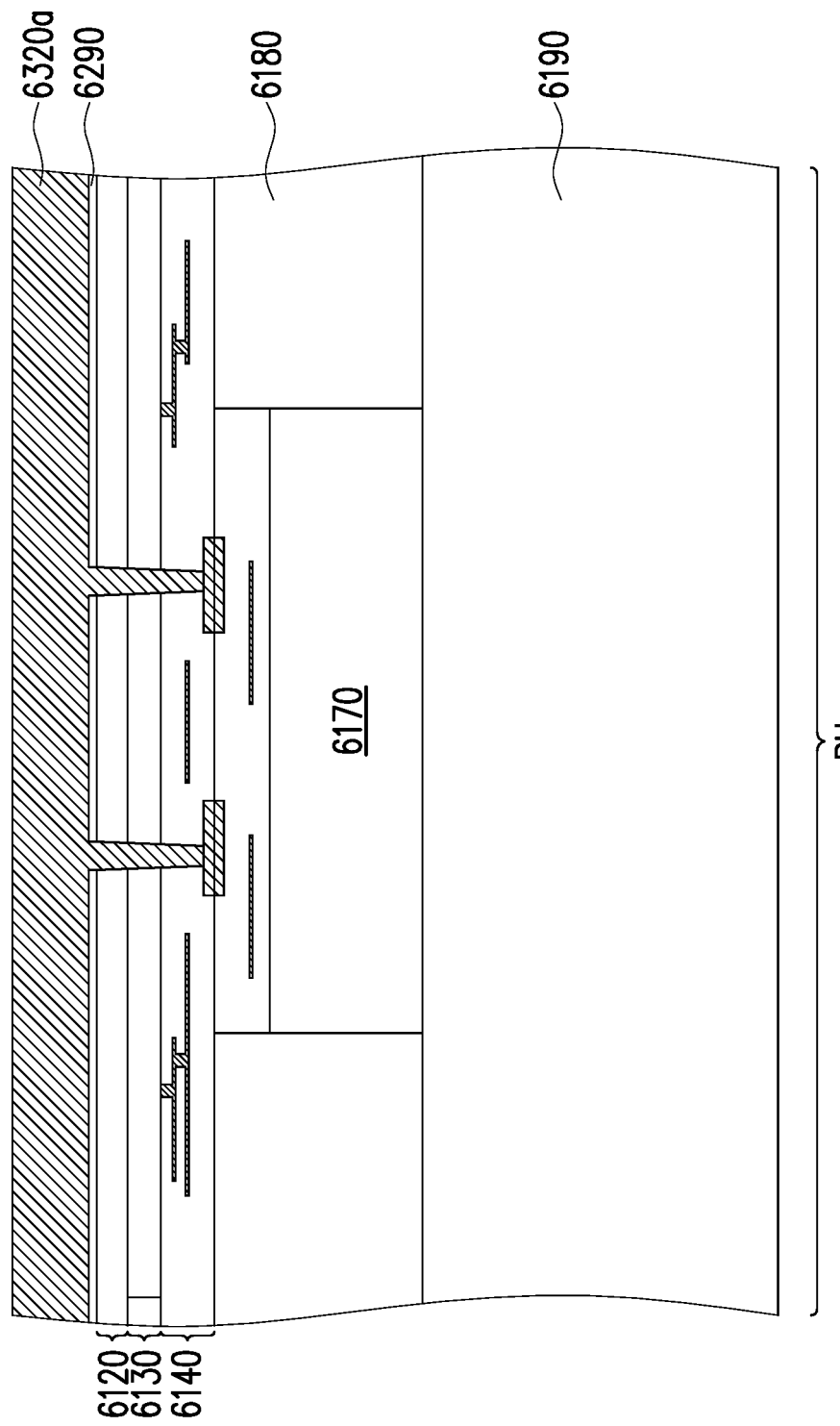

Referring to FIG. 13E, in some embodiments, via openings 6310 are formed in correspondence of the mask openings 6302, extending through the etch stop layer 6290, the insulator layer 6120, the device layer 6130 and the interconnection structure 6140. The via openings 6310 may be formed, for example, via one or more etching steps. In some embodiments, the bonding pads 6164 are exposed at the bottom of the via openings 6310. Referring to FIG. 13E and FIG. 13F, the auxiliary mask 6300 may be removed, for example via etching or ashing, to expose the etch stop layer 6290. Referring to FIG. 13F and FIG. 13G, a conductive material 6320a may be formed in the via openings 6310 and on the etch stop layer 6290, for example via a plating process. The plating process is, for example, electro-plating, electroless-plating, immersion plating, or the like. The conductive material 6320a includes, for example, aluminum, titanium, copper, nickel, tungsten, or alloys thereof. Referring to FIG. 13G and FIG. 13H, the portion of conductive material 6320a extending on the etch stop layer 6290 may be removed until the etch stop layer 6290 is exposed, for example during a chemical mechanical planarization (CMP) process. In some embodiments, the etch stop layer 6290 may be resistant to the conditions adopted during the planarization process. The portions of conductive material 6320a remaining in the via openings 6310 form the bonding vias 6320.

Figure 13I:
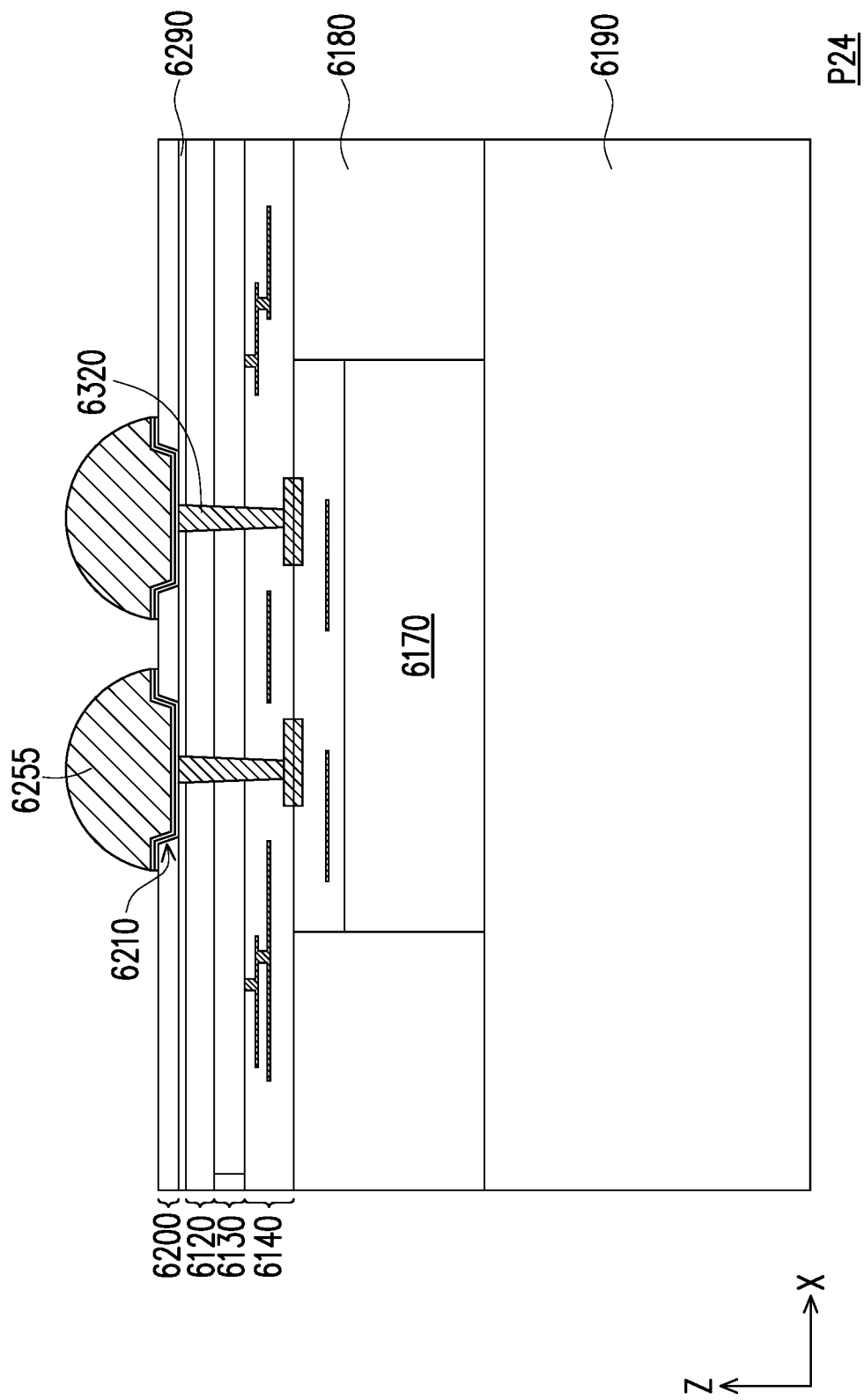
Figure 14:
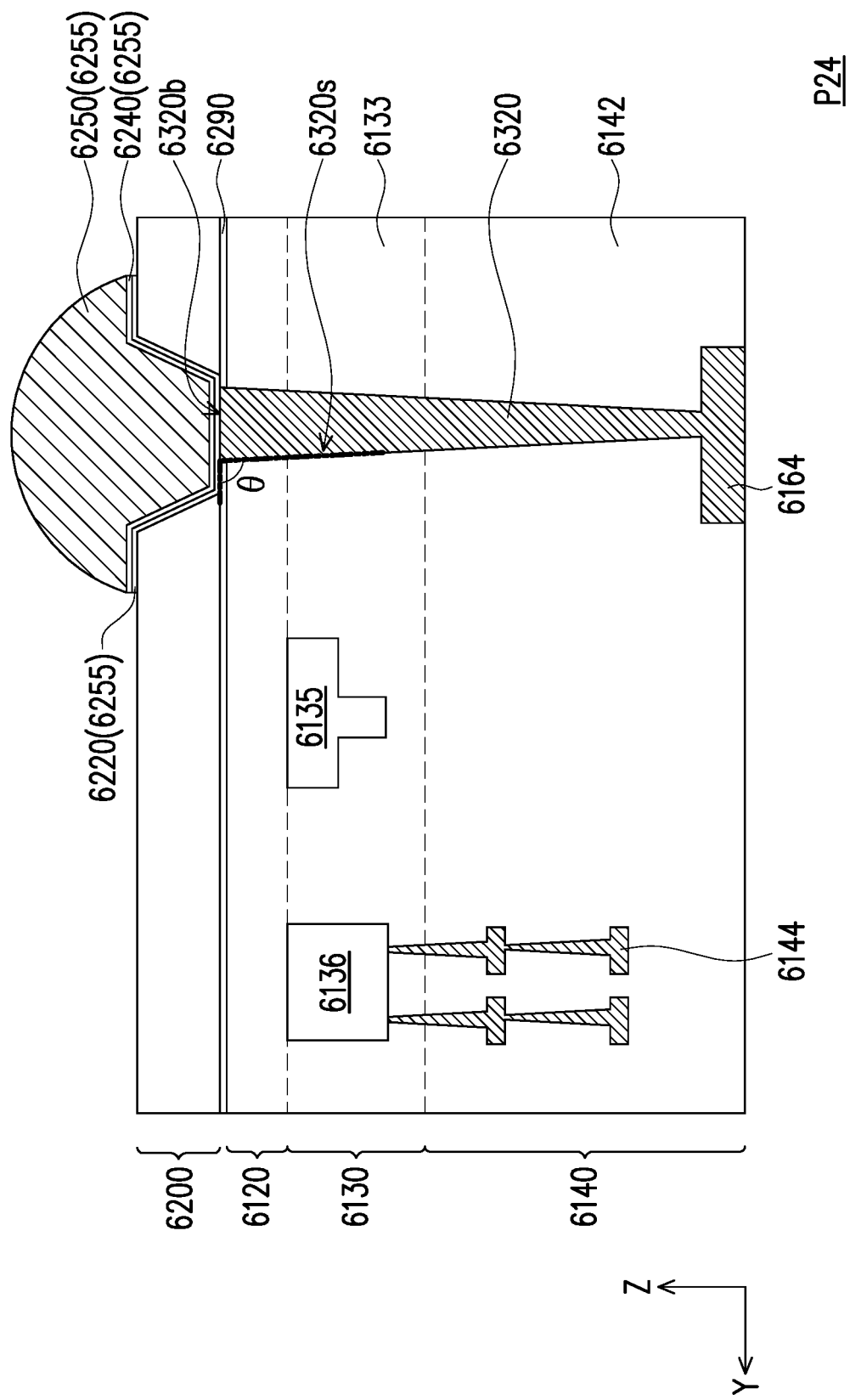
FIG. 14 is a schematic cross-sectional view of a portion of a semiconductor package in accordance with some embodiments of the disclosure.

FIG. 13I is a schematic cross-sectional view of the semiconductor package P24 according to some embodiments of the disclosure. FIG. 14 is a schematic cross-sectional view of a portion of the semiconductor package P24 according to some embodiments of the disclosure. The schematic cross-sectional view of FIG. 14 is taken in a YZ plane corresponding to the plane of view of FIG. 2B, in a corresponding region of the semiconductor package P24. In some embodiments, the semiconductor package P24 illustrated in FIG. 13I may be fabricated following process steps similar to the ones previously described with reference from FIG. 1J to FIG. 1M. Briefly, the buffer layer 6200 including the contact openings 6210 is formed on the etch stop layer 6290, and the connective terminals 6255 are formed within the contact openings 6210. Singulation of the semiconductor package P24 may be performed, if required. As illustrated in FIG. 14, the order of the layers in the semiconductor package P24 may be similar with respect to the semiconductor package P22 of FIG. 12, with the etch stop layer 6290 disposed between the buffer layer 6200 and the insulator layer 6120, and the connective terminals 6255 reaching the insulator layer 6120 with the etch stop layer 6290 interposed in between. The devices of the device layer 6130 (e.g., the waveguides 6135 and the optical devices 6136) may be located just below the interface between the insulator layer 6120 and the device layer 6130, and the conductive patterns 6144 of the interconnection structure 6140 may extend through the dielectric layer 6142 and the additional insulator material 6133 to contact the devices of the device layer 6130.

In some embodiments, the connective terminals 6255 extend on the ends 6320b of the bonding vias 6320 further away from the bonding pads 6164 and on the etch stop layer 6290, in a similar fashion as described for the semiconductor package P22 of FIG. 12. However, the disclosure is not limited thereto. In some alternative embodiments, the connective terminals 6255 may laterally wrap the ends 6320b of the bonding vias 6320, in a similar manner previously described for the semiconductor package P18 of FIG. 8. As illustrated in FIG. 14, in some embodiments the tapering angle θ of the bonding vias 6320 may be greater than 90 degrees. The tapering angle θ may be measured between the connective terminal 6255 and the sidewall 6320s of the bonding via. In some embodiments, the tapering angle θ may be in the range from 91 to 95 degrees. That is, the width of the bonding via 6320 along the X or Y direction may decrease proceeding from the connective terminal 6255 towards the bonding pad 6164.

In accordance with some embodiments of the disclosure, a semiconductor package includes a semiconductor die, a device layer, an insulator layer, a buffer layer, and connective terminals. The device layer is stacked over the semiconductor die. The device layer includes an edge coupler located at an edge of the semiconductor package and a waveguide connected to the edge coupler. The insulator layer is stacked over the device layer and includes a first dielectric material. The buffer layer is stacked over the insulator layer. The buffer layer includes a second dielectric material. The connective terminals are disposed on the buffer layer and reach the insulator layer through contact openings of the buffer layer.

In accordance with some embodiments of the disclosure, a semiconductor package includes an interconnection structure, a semiconductor die, a device layer, an insulator layer, and a buffer layer. The semiconductor die is connected to one side of the interconnection structure. The device layer is disposed at an opposite side of the interconnection structure with respect to the semiconductor die. The device layer includes an optical device, an edge coupler, and a waveguide. The edge coupler is located at an edge of the semiconductor package and is adapted to receive light of at least one wavelength. The waveguide is adapted to transmit the light from the edge coupler to the optical device. The insulator layer is disposed at an opposite side of the device layer with respect to the interconnection structure. The insulator layer includes a first dielectric material. The buffer layer is disposed on the device layer. The buffer layer includes a second dielectric material, wherein, at the at least one wavelength, a refractive index of the second dielectric material is in a range from a refractive index of air to a refractive index of the first dielectric material.

In accordance with some embodiments of the disclosure, a manufacturing method of a semiconductor package includes the following steps. A device layer including at least one waveguide is formed from a front semiconductor layer. The front semiconductor layer is stacked on an insulator layer comprising a first dielectric material. An interconnection structure is formed on the device layer, the interconnection structure having bonding pads formed at a top surface of the interconnection structure. A semiconductor die is bonded to the bonding pads of the interconnection structure. A buffer layer is formed at an opposite side of the insulator layer with respect to the device layer. The buffer layer includes a second dielectric material. Portions of the buffer layer are removed to form contact openings in the buffer layer. Connective terminals are formed in the contact openings. The connective terminals reach the insulator layer through the buffer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
    a semiconductor die;
    a device layer stacked over the semiconductor die, the device layer comprising a base layer, a mode coupler located at an edge of the semiconductor package and a waveguide connected to the mode coupler;
    an insulator layer stacked over the device layer, the insulator layer comprising a first dielectric material;
    a buffer layer stacked over the insulator layer, the buffer layer comprising a second dielectric material;
    bonding vias extending through the base layer of the device layer;
    connective terminals, disposed on the buffer layer and reaching the insulator layer through contact openings of the buffer layer, wherein the bonding vias electrically connect the semiconductor die to the connective terminals, the bonding vias are spaced apart from the insulator layer by the connective terminals, and ends of the bonding vias protrude from a surface of the device layer; and
    an etch stop layer disposed in contact with the insulator layer on one side, and spaced apart from the waveguide by the base layer, wherein the etch stop layer comprises a material conferring etching selectivity to the etch stop layer with respect to the first dielectric material, and portions of the etch stop layer surrounding the bonding vias are in contact with the connective terminals.

2. The semiconductor package of claim 1, wherein the second dielectric material is silicon oxide.

3. The semiconductor package of claim 1, wherein the insulator layer is in direct contact with the buffer layer, and the bonding vias are spaced apart from the buffer layer by the connective terminals.

4. The semiconductor package of claim 1, further comprising an interconnection structure disposed between the semiconductor die and the device layer.

5. The semiconductor package of claim 1, wherein the ends of the bonding vias are in contact with the connective terminals, and the connective terminals are in contact with a top surface of the etch stop layer.

6. The semiconductor package of claim 5, wherein the ends of the bonding vias and the top surface of the etch stop layer are substantially coplanar.

7. The semiconductor package of claim 1, wherein the etch stop layer contacts the base layer of the device layer, and the connective terminals extend through the buffer layer and the insulator layer.

8. A semiconductor package, comprising:
    an interconnection structure;
    a semiconductor die connected to one side of the interconnection structure;
    a device layer disposed at an opposite side of the interconnection structure with respect to the semiconductor die, the device layer comprising:
        a base layer;
        an optical device;
        a mode coupler located at an edge of the semiconductor package, wherein the mode coupler is configured to receive light of at least one wavelength; and a waveguide configured to transmit the light from the mode coupler to the optical device, an insulator layer, disposed at an opposite side of the device layer with respect to the interconnection structure;

a buffer layer, disposed on the insulator layer;

bonding vias extending through the base layer of the device layer and the interconnection structure along a first direction;

connective terminals, disposed on the buffer layer, wherein the bonding vias electrically connect the semiconductor die to the connective terminals, the bonding vias are spaced apart from the insulator layer by the connective terminals, and ends of the bonding vias are in contact with the connective terminals; and an etch stop layer disposed between the insulator layer and the base layer of the device layer, wherein a top surface of the etch stop layer is in contact with the insulator layer and the connective terminal.

9. The semiconductor package of claim 8, wherein, along the edge of the semiconductor package where the mode coupler is located, a side surface of the insulator layer and a side surface of the buffer layer are substantially coplanar.

10. The semiconductor package of claim 8, wherein the connective terminals are in contact with a top surface of the buffer layer, and extend on portions of the top surface of the etch stop layer immediately adjacent to the bonding vias.

11. The semiconductor package of claim 8, wherein the bonding via electrically connects the semiconductor die to the connective terminal, and a full thickness of the bonding via measured along a second direction increases proceeding from the connective terminal towards the semiconductor die, wherein the first direction is perpendicular to the second direction, and the bonding vias are spaced apart from the buffer layer by the connective terminals.

12. The semiconductor package of claim 8, wherein the device layer further comprises a cover layer, and the base layer and the cover layer stacked in order along the first direction on the etch stop layer.

13. The semiconductor package of claim 12, wherein the waveguide is spaced apart from the etch stop layer by the base layer.

14. The semiconductor package of claim 8, wherein, at the at least one wavelength, a refractive index of the buffer layer is in a range from a refractive index of air to a refractive index of the insulator layer, and the at least one wavelength is in the range from 1.33 µm to 1.55 µm.

15. A manufacturing method of a semiconductor package, comprising:

forming a device layer comprising a base layer; an optical device; a mode coupler located at an edge of the semiconductor package; and at least one waveguide configured to transmit the light from the mode coupler to the optical device from a front semiconductor layer, the front semiconductor layer being stacked on an insulator layer comprising a first dielectric material, wherein the mode coupler is configured to receive light of at least one wavelength;

forming an interconnection structure on the device layer, the interconnection structure having bonding pads formed at a top surface of the interconnection structure;

bonding a semiconductor die to the bonding pads of the interconnection structure;

forming a buffer layer at an opposite side of the insulator layer with respect to the device layer, wherein the buffer layer includes a second dielectric material;

removing portions of the buffer layer to form contact openings in the buffer layer; and forming connective terminals in the contact openings, wherein the connective terminals reach the insulator layer through the buffer layer, wherein before the device layer is formed from the front semiconductor layer, an etch stop layer is formed on a layer selected from a bulk semiconductor layer and the insulator layer, and the front semiconductor layer is stacked on the insulator layer and the bulk semiconductor layer when the device layer is formed, and the manufacturing method further comprises removing first portions of the interconnection structure to form trenches at the top surface of the interconnection structure;

filling a first conductive material in the trenches to form the bonding pads; removing second portions of the interconnection structure to form via openings connected to the trenches; and filling a second conductive material in the via openings to form bonding vias electrically connected to the bonding pads, the bonding vias extends through the base layer of the device layer and the interconnection structure along a first direction, the bonding vias electrically connect the semiconductor die to the connective terminals, the bonding vias are spaced apart from the insulator layer by the connective terminals, and distal ends of the bonding vias with respect to the bonding pads are in contact with a portion of bottom surfaces of the connective terminals, and another portion of the bottom surfaces of the connective terminals are in contact with the etch stop layer, and the portion of bottom surfaces of the connective terminals is substantially coplanar with the another portion of the bottom surfaces of the connective terminals.

16. The manufacturing method of claim 15, the manufacturing method further comprising removing the bulk semiconductor layer after the device layer is formed.

17. The manufacturing method of claim 15, wherein a material of the buffer layer is silicon oxide.

18. The manufacturing method of claim 15, wherein the contact openings expose the distal ends of the bonding vias.

19. The manufacturing method of claim 18, wherein the contact openings extend through the buffer layer and the insulator layer.

20. The manufacturing method of claim 18, wherein the via openings and the trenches are filled during a same plating process.

* * * * *